United States Patent
Tokiwa

(10) Patent No.: US 9,875,804 B2
(45) Date of Patent: Jan. 23, 2018

(54) NONVOLATILE SEMICONDUCTOR MEMORY DEVICE WITH READ VOLTAGE SETTING CONTROLLER

(71) Applicant: TOSHIBA MEMORY CORPORATION, Tokyo (JP)

(72) Inventor: Naoya Tokiwa, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/331,606

(22) Filed: Oct. 21, 2016

(65) Prior Publication Data
US 2017/0255385 A1 Sep. 7, 2017

(30) Foreign Application Priority Data
Mar. 2, 2016 (JP) .................. 2016-040065

(51) Int. Cl.
*G11C 11/26* (2006.01)
*G11C 16/26* (2006.01)
(Continued)

(52) U.S. Cl.
CPC .............. *G11C 16/26* (2013.01); *G06F 3/061* (2013.01); *G06F 3/0619* (2013.01);
(Continued)

(58) Field of Classification Search
CPC ......... G11C 16/26; G11C 11/34; G11C 16/10; G11C 16/28; G11C 16/3427; G11C 16/16;
(Continued)

(56) References Cited

U.S. PATENT DOCUMENTS 7,558,109 B2  7/2009  Brandman et al.
7,852,675 B2  12/2010  Maejima
(Continued)

FOREIGN PATENT DOCUMENTS

JP  2010509700 A  3/2010
JP  2013122804 A  6/2013
JP  2014154169 A  8/2014

OTHER PUBLICATIONS

G. Naso et al., ISSCC 2013, Session 12, Non-Volatile Memory Solutions, 12.5, A 128Gb 3b/cell NAND Flash Design Using 20nm Planar-Cell Technology, IEEE International Solid-State Circuits Conference, 2013, 3 pages.
(Continued)

*Primary Examiner* — Richard Elms
*Assistant Examiner* — Ajay Ojha
(74) *Attorney, Agent, or Firm* — Patterson & Sheridan, LLP

(57) ABSTRACT

A nonvolatile semiconductor memory device includes a memory cell array. The memory cells of the memory cell array can be programmed to have different threshold voltages. A word line is connected to the memory cells. A controller is configured to receive a first command and perform a first read sequence and a second read sequence to read data from the memory cell array. In the first read sequence, a series of different voltage levels are applied to the word line and data is read from the array at each voltage level. In the second read sequence, a read voltage level is set based on the data obtained during the first read sequence. The read voltage level is applied to the word line to read the data to be output from the memory cell array.

15 Claims, 23 Drawing Sheets

(51) Int. Cl.
*G06F 3/06* (2006.01)
*G11C 16/10* (2006.01)
*G11C 16/28* (2006.01)
*G11C 16/34* (2006.01)
*G11C 16/16* (2006.01)
*G11C 11/34* (2006.01)

(52) U.S. Cl.
CPC .......... *G06F 3/0634* (2013.01); *G06F 3/0659* (2013.01); *G06F 3/0679* (2013.01); *G11C 16/10* (2013.01); *G11C 16/16* (2013.01); *G11C 16/28* (2013.01); *G11C 16/3427* (2013.01); *G11C 11/34* (2013.01)

(58) Field of Classification Search
CPC ...... G06F 3/061; G06F 3/0679; G06F 3/0619; G06F 3/0634; G06F 3/0659
See application file for complete search history.

(56) References Cited

U.S. PATENT DOCUMENTS

| | | | |
|---|---|---|---|
| 7,948,802 B2 | 5/2011 | Sarin et al. | |
| 8,233,323 B2 | 7/2012 | Hishida et al. | |
| 8,372,720 B2 | 2/2013 | Fukuzumi et al. | |
| 8,446,787 B2 | 5/2013 | Sarin et al. | |
| 8,451,664 B2 | 5/2013 | Radke et al. | |
| 8,514,627 B2 | 8/2013 | Itagaki et al. | |
| 8,952,426 B2 | 2/2015 | Maejima | |
| 9,036,411 B2 | 5/2015 | Itagaki | |
| 9,117,536 B2* | 8/2015 | Yoon | G11C 11/5642 |
| 2009/0003057 A1* | 1/2009 | Kang | G11C 11/5642 365/185.03 |
| 2010/0020611 A1* | 1/2010 | Park | G06F 11/1068 365/185.09 |
| 2011/0284946 A1 | 11/2011 | Kiyotoshi | |
| 2013/0148436 A1 | 6/2013 | Kurosawa | |
| 2014/0229131 A1 | 8/2014 | Cohen et al. | |
| 2016/0148703 A1* | 5/2016 | Kim | G11C 16/26 365/185.11 |

OTHER PUBLICATIONS

Jae-Woo Im et al., ISSCC 2015, Session 7, Non-Volatile Memory Solutions, 7.2, A 128Gb 3b/cell V-NAND Flash Memory with 1Gb/s I/O Rate, IEEE International Solid-State Circuits Conference, 2015, 3 pages.

* cited by examiner

FIG. 11

| WORD LINE VOLTAGE REFERENCE VALUE | VOLTAGE DIFFERENCE | XDL contents | ADL contents | BDL contents | Required operation | RESULT REGISTER | |
|---|---|---|---|---|---|---|---|
| AR3 | -A_DELTA×4 | | ... | ... | STB | ↙ | FIRST STATE |
| | -A_DELTA×3 | | (A1) read | | ADL=SDL<br>STB | Pass or fail (1st) | SECOND STATE |
| | -A_DELTA×2 | | (A2) read | (A1) read | BDL=ADL<br>ADL=SDL<br>TAG=ADL&/BDL<br>All 0 detection<br>STB | Pass or fail (2nd) | THIRD STATE |
| | -A_DELTA×1 | | (A3) read | (A2) read | BDL=ADL<br>ADL=SDL<br>TAG=ADL&/BDL<br>All 0 detection<br>STB | Pass or fail (3rd) | FOURTH STATE |
| | 0 | | (A4) read | (A3) read | BDL=ADL<br>ADL=SDL<br>TAG=ADL&/BDL<br>All 0 detection<br>STB | Pass or fail (4th) | FIFTH STATE |
| | ... | AR w/best Read level | (A5) read | (A4) read | BDL=ADL<br>ADL=SDL<br>TAG=ADL&/BDL<br>All 0 detection | ... | SIXTH STATE |
| | Proper level | | ... | ... | STB<br>XDL=SDL | | |

| | | 0th | 1st | 2nd | 3rd | 4th | 5th | Contents |
|---|---|---|---|---|---|---|---|---|
| FIRST STATE | SDL | 1 | 0 | 0 | 0 | 0 | 0 | (A1) read result |
| | ADL | 1 | 0 | 0 | 0 | 0 | 0 | (A1) read result |
| | BDL | - | - | - | - | - | - | - |
| | TAG | - | - | - | - | - | - | - |
| SECOND STATE | SDL | 1 | 1 | 0 | 0 | 0 | 0 | (A2) read result |
| | ADL | 1 | 1 | 0 | 0 | 0 | 0 | (A2) read result |
| | BDL | 1 | 0 | 0 | 0 | 0 | 0 | (A1) read result |
| | TAG | - | - | - | - | - | - | - |
| THIRD STATE | SDL | 1 | 1 | 1 | 0 | 0 | 0 | (A3) read result |
| | ADL | 1 | 1 | 1 | 0 | 0 | 0 | (A3) read result |
| | BDL | 1 | 1 | 0 | 0 | 0 | 0 | (A2) read result |
| | TAG | 0 | 1 | 0 | 0 | 0 | 0 | Bit # from 1 to 2 |
| FOURTH STATE | SDL | 1 | 1 | 1 | 1 | 0 | 0 | (A4) read result |
| | ADL | 1 | 1 | 1 | 1 | 0 | 0 | (A4) read result |
| | BDL | 1 | 1 | 1 | 0 | 0 | 0 | (A3) read result |
| | TAG | 0 | 0 | 1 | 0 | 0 | 0 | Bit # from 2 to 3 |
| FIFTH STATE | SDL | 1 | 1 | 1 | 1 | 1 | 0 | (A5) read result |
| | ADL | 1 | 1 | 1 | 1 | 1 | 0 | (A5) read result |
| | BDL | 1 | 1 | 1 | 1 | 0 | 0 | (A4) read result |
| | TAG | 0 | 0 | 0 | 1 | 0 | 0 | Bit # from 3 to 4 |
| SIXTH STATE | SDL | - | - | - | - | - | - | - |
| | ADL | 1 | 1 | 1 | 1 | 1 | 0 | (A5) read result |
| | BDL | 1 | 1 | 1 | 1 | 0 | 0 | (A4) read result |
| | TAG | 0 | 0 | 0 | 0 | 1 | 0 | Bit # from 4 to 5 |

FIG. 16

| PF_1ST | PF_2ND | PF_3RD | PF_4TH | OPTIMUM VALUE DETERMINATION |
|---|---|---|---|---|
| 0(fail) | 0(fail) | 0(fail) | 0(fail) | OPTIMUM VALUE IS NOT FOUND |
| 0 | 0 | 0 | 1 | OPTIMUM VALUE IS NOT FOUND |
| 0 | 0 | 1 | 0 | OPTIMUM VALUE IS NOT FOUND |
| 0 | 0 | 1 | 1 | (A4) READ IS OPTIMUM |
| 0 | 1 | 0 | 0 | OPTIMUM VALUE IS NOT FOUND |
| 0 | 1 | 0 | 1 | OPTIMUM VALUE IS NOT FOUND |
| 0 | 1 | 1 | 0 | (A3) READ IS OPTIMUM |
| 0 | 1 | 1 | 1 | (A3) READ IS OPTIMUM |
| 1 | 0 | 0 | 0 | OPTIMUM VALUE IS NOT FOUND |
| 1 | 0 | 0 | 1 | OPTIMUM VALUE IS NOT FOUND |
| 1 | 0 | 1 | 0 | OPTIMUM VALUE IS NOT FOUND |
| 1 | 0 | 1 | 1 | OPTIMUM VALUE IS NOT FOUND |
| 1 | 1 | 0 | 0 | (A1) READ IS OPTIMUM |
| 1 | 1 | 0 | 1 | (A1) READ IS OPTIMUM |
| 1 | 1 | 1 | 0 | (A1) READ IS OPTIMUM |
| 1(pass) | 1(pass) | 1(pass) | 1(pass) | (A1) READ IS OPTIMUM |

FIG. 19

| | WORD LINE VOLTAGE REFERENCE VALUE | VOLTAGE DIFFERENCE | XDL contents | ADL contents | BDL contents | Required operation | RESULT REGISTER |
|---|---|---|---|---|---|---|---|
| S101 | AR3 | -A_DELTA×4 | | ... | | STB | |
| S102 | | -A_DELTA×3 | | (A1) read | | ADL=SDL<br>STB | |
| S103 | | -A_DELTA×2 | | (A2) read | (A1) read | BDL=ADL<br>ADL=SDL<br>TAG=ADL&BDL<br>All 0 detection<br>STB | Pass or fail (1st) |
| S104 | | -A_DELTA×1 | | (A3) read | (A2) read | BDL=ADL&BDL<br>ADL=SDL<br>TAG=ADL&BDL<br>All 0 detection<br>STB | Pass or fail (2nd) |
| S105 | | 0 | | (A4) read | (A3) read | BDL=ADL&BDL<br>ADL=SDL<br>TAG=ADL&BDL<br>All 0 detection<br>STB | Pass or fail (3rd) |
| S106 | | ... | | (A5) read | (A4) read | BDL=ADL&BDL<br>ADL=SDL<br>TAG=ADL&BDL<br>All 0 detection | Pass or fail (4th) |
| S107 | | | | | | | |
| S108 | | Proper level | AR w/best Read level | | | STB<br>XDL=SDL | |

FIG. 23

DATA OF XDL

| | COLUMN ADDRESS | |
|---|---|---|
| S302 | 0 | THE NUMBER OF BITS OF INTERVAL BETWEEN R1 AND R2 |
| S303 | 1 | THE NUMBER OF BITS OF INTERVAL BETWEEN R2 AND R3 |
| S304 | 2 | THE NUMBER OF BITS OF INTERVAL BETWEEN R3 AND R4 |
| ⋮ | ⋮ | |
| S305 | n-2 | THE NUMBER OF BITS OF INTERVAL BETWEEN R(n-1) AND Rn |

NONVOLATILE SEMICONDUCTOR MEMORY DEVICE WITH READ VOLTAGE SETTING CONTROLLER

CROSS-REFERENCE TO RELATED APPLICATION

This application is based upon and claims the benefit of priority from Japanese Patent Application No. 2016-040065, filed Mar. 2, 2016, the entire contents of which are incorporated herein by reference.

FIELD

Embodiments described herein relate generally to a nonvolatile semiconductor memory device.

BACKGROUND

Generally, a NAND-type flash memory is known as an example of a nonvolatile semiconductor memory device.

DESCRIPTION OF THE DRAWINGS

FIG. 11 is a diagram illustrating aspects of an operation of a cache in the search read.
FIG. 13 is a diagram illustrating aspects of an example of data of the cache from a first state to a fifth state.
FIG. 16 is a diagram illustrating aspects of an example of a determination table for determining an optimal read level.
FIG. 19 is a diagram illustrating aspects of the operation of the cache in search read according to a third modification example.
FIG. 23 is a diagram illustrating aspects of data of a cache according to the fourth modification example.

DETAILED DESCRIPTION

In general, according to the embodiment, a nonvolatile semiconductor memory device includes: a memory cell array including a plurality of memory cells, each of which can be programmed to have a different threshold voltage. A word line is connected to the plurality of memory cells. A controller is configured to receive a first command and to perform a first read sequence and a second read sequence to read data to be output from the memory cell array. In the first read sequence, a series of different voltage levels are applied to the word line to read data from the memory cell array at each different voltage level. In the second read sequence, a read voltage level set based on the data read from the memory cell array during the first read sequence is applied to the word line to read the data to be output from the memory cell array in response to the first command.

Hereinafter, exemplary embodiments will be described with reference to the drawings.

A semiconductor memory device according to the embodiment is a nonvolatile semiconductor memory capable of being written and rewritten with data. In the present disclosure, a NAND-type flash memory will be described as an example of a nonvolatile semiconductor memory device.

1 First Embodiment

1-1 Configuration of Memory System

Figure 1:
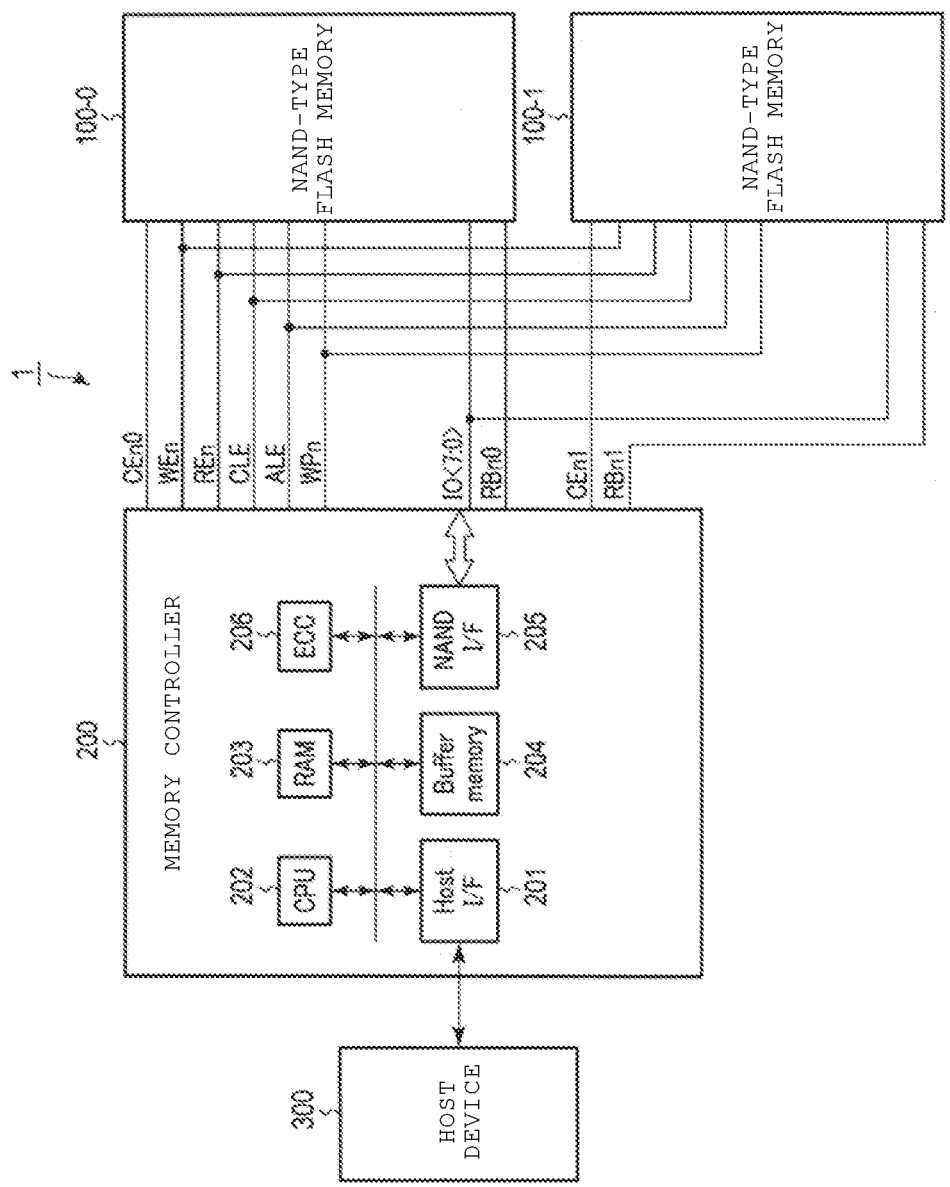
FIG. 1 is a block diagram of a memory system according to an embodiment.

A configuration of a memory system 1 including a nonvolatile semiconductor memory device will be described by using FIG. 1. The memory system 1 includes a memory controller 200 and one or more nonvolatile semiconductor memory device (s) (NAND-type flash memory) 100. Two NAND-type flash memories (100-0 and 100-1) are illustrated in FIG. 1.

The memory system 1 may be formed by mounting a plurality of chips of the memory system 1 on a motherboard on which a host device 300 is also mounted, and the memory system 1 may be configured as a large-scale integrated circuit (LSI) or a system-on-chip (SoC) realized as one module/unit. As an example of the memory system 1, there is a memory card such as a secure digital (SD) card, a solid state drive (SSD), an embedded multimedia card (eMMC), and the like.

The NAND-type flash memory 100 includes a plurality of memory cells and stores data in a nonvolatile manner. The details relating to a configuration of the NAND-type flash memory 100 will be described below.

The memory controller 200 commands writing (also referred to as programming), reading, erasing, or the like of the NAND-type flash memory 100, in response to a command from the host device 300. In addition, the memory controller 200 manages the memory space of the NAND-type flash memory 100. The memory controller 200 includes a host interface circuit (host I/F) 201, a central processing unit (CPU) 202, a random access memory (RAM) 203, a buffer memory 204, a NAND interface circuit (NAND I/F) 205, an error checking and correcting (ECC) circuit 206, and the like.

The host interface circuit 201 is connected to the host device 300 through a controller bus and performs an interface process with the host device 300. In addition, the host interface circuit 201 handles communication of commands and data to/from the host device 300.

The CPU 202 controls overall operations of the memory controller 200. For example, when the CPU 202 receives a write command from the host device 300, the CPU 202 issues a write command based on a NAND interface protocol to the NAND-type flash memory 100 in response to the write command. This is also similarly the case for reading and erasing operations. In addition, the CPU 202 performs various processing operations such as wear leveling, and the like for managing the NAND-type flash memory 100.

The RAM 203 is used as a work area of the CPU 202, and stores firmware loaded from the NAND-type flash memory 100 and various tables created by the CPU 202. The RAM 203 is comprised by, for example, by DRAM. The buffer memory 204 temporarily holds data transmitted from the host device 300, and temporarily holds data transmitted from the NAND-type flash memory 100.

The ECC circuit 206 generates an error correction code and, when writing data, adds the error correction code to the write data, and transmits the added result to the NAND interface circuit 205. In addition, the ECC circuit 206 performs error detection and error correction, when data is being read, by using an error correction code included in read data. The ECC circuit 206 may optionally be provided within the NAND interface circuit 205.

The NAND interface circuit 205 is connected to the NAND-type flash memory 100 through a NAND bus and performs an interface process with the NAND-type flash memory 100. In addition, the NAND interface circuit 205 handles communication of commands and data to/from the NAND-type flash memory 100.

The NAND-type flash memory 100 is connected to the memory controller 200 through a control signal line group, an input and output bus, or the like. The NAND-type flash memory 100 is configured to receive commands, address information, and write data from the memory controller 200, and transmit read data to the memory controller 200.

A chip enable signal CEn, a write enable signal WEn, a read enable signal REn, a command latch enable signal CLE, an address latch enable signal ALE, a write protect signal WPn, an input and output signal IO<7:0>, and a ready and busy signal (ready/busy pin signal) RBn are included in signals between the memory controller 200 and the NAND-type flash memory 100. The "n" attached to the signal names represents active low that is, the signal has a logical "low" value when it is intended to indicate the corresponding aspect is active/enabled. The write enable signal WEn, the read enable signal REn, the command latch enable signal CLE, the address latch enable signal ALE, the write protect signal WPn, and the input and output signal IO<7:0> are commonly used for a plurality of NAND-type flash memories 100. However, the chip enable signal CEn and the ready and busy signal RBn are individually provided for the NAND-type flash memories 100. Signals and connection methods thereof may be modified if necessary.

1-1-1 Configuration of NAND-Type Flash Memory 100

A configuration of the NAND-type flash memory 100 will be described by using FIG. 2. A structure of an internal block of the NAND-type flash memory 100 is divided into a core unit 10 and a peripheral circuit 20.

The core unit 10 includes a cell array (memory cell array) 11 having a plurality of memory cells, a row decoder 12, and a sense unit 13.

The row decoder 12 selects the cell array 11 on a block basis, and applies a desired voltage to word lines. That is, the row decoder 12 receives various voltages according to an operation from a voltage generating circuit (not specifically illustrated), and applies various voltages to the plurality of word lines for a block.

When reading data, the sense unit 13 detects and amplifies data that is read on a bit line connected to a memory cell. In addition, the sense unit 13 transmits write data to the memory cell when writing data. Reading and writing of data to the cell array 11 are performed on a unit basis on a plurality of memory cells referred to as a page or a page unit. A specific configuration of the sense unit 13 will be described below.

The peripheral circuit 20 includes input buffers 21 and 22, an output buffer 23, an address buffer 24, a command decoder 25, a data buffer 26, a selection circuit 27, a selection circuit 28, a state machine (control circuit) 29, a memory cell control register 30, an output buffer 31, a register circuit 32, and a fail number count circuit 33.

The input buffer 21 is connected to a plurality of terminals (pins) that respectively receive the chip enable signal CEn, the write enable signal WEn, the read enable signal REn, the command latch enable signal CLE, the address latch enable signal ALE, and the write protect signal WPn. The input buffer 21 recognizes command input, address input, data input, a write inhibited state, and a chip selection/non-selection state according to a logical state of values on the plurality of pins, and notifies the command decoder 25, the input buffer 22, the output buffer 23, or the like of the states.

The input buffer 22 is connected to a bi-directional bus IO<7:0>. The input buffer 22 outputs, as data signal DIN, data that is input through the bi-directional bus IO<7:0> from the memory controller 200 in response to a command from the input buffer 21.

The output buffer 23 receives output of the selection circuit 27, and outputs read data to the bi-directional bus IO<7:0> at a predetermined timing.

The address buffer 24 receives address data included in a data signal DIN from the input buffer 22, and temporarily holds this address data. The address data is divisible into a block address BLKa, a string address STRa, a word line address WLa, and a column address COLa according to an input order and an input bit position.

The command decoder 25 receives the data signal DIN from the input buffer 22 in response to a command from the input buffer 21, and outputs a command signal included in the data signal DIN. A signal CMD_READ for commanding read, a signal CMD_TRACK for commanding search read (described below), and a signal CMD_TRACKRESULT for commanding output of a search read result to external are included in the command signals that may be output from the command decoder 25. The command decoder 25 also outputs, for example, a command signal related to the writing operations other than the above-mentioned command signals.

The data buffer 26 receives the data signal DIN from the input buffer 22 in response to a command from the input buffer 21, and temporarily holds write data included in the data signal DIN. The data buffer 26 transmits data to the sense unit 13 through the selection circuit 28.

The selection circuit 27 selects between output of the read data from the sense unit 13 and a signal PF from the state machine 29 according to the logical state of the signal CMD_TRACKRESULT, and transmits the selected one of these signals to the output buffer 23.

The selection circuit 28 is a directional selection circuit that determines whether data is transmitted from the data buffer 26 to the sense unit 13 or from the sense unit 13 to the selection circuit 27.

The state machine 29 controls operations such as reading, writing, and erasing in the NAND-type flash memory 100. In the present embodiment, the state machine 29 receives output of the command decoder 25, and primarily controls the memory cell control register 30. Specifically, the state machine 29 performs operations such as proper address selections of memory cells and applies a desired voltage to a desired node. In addition, the state machine 29 performs selection of the proper register in the register circuit 32, and calculation and output of an output signal F_NF from the register circuit 32.

The state machine 29 includes registers PF_1ST, PF_2ND, PF_3RD, and PF_4TH therein. The number of the registers provided in the state machine 29 can be arbitrarily set. Data from the registers PF_1ST, PF_2ND, PF_3RD, and PF_4TH is output (as the signal PF) to the selection circuit 27 by a proper selection of unit. In addition, the registers PF_1ST, PF_2ND, PF_3RD, and PF_4TH hold information of an output signal PASS from the fail number count circuit 33. A specific holding method will be described below.

The memory cell control register 30 outputs a signal for controlling detail operations of writing, reading, and erasing in the memory cell(s) corresponding to the addresses BLKa, STRa, WLa, and COLa from the address buffer 24 and an operation commanding signal of the state machine 29. The signal output from the memory cell control register 30 includes a block address BLKADD, a string address STRADD, a word line address WLADD, and a column address COLADD.

The block address BLKADD designates a selected block. The string address STRADD designates a voltage of a selection gate signal for selecting one of a plurality of strings configuring a block of the memory cell. The word line address WLADD designates a selection voltage to be applied to a selected word line and a non-selection voltage to be applied to a non-selected word line. The column address COLADD may designate a cache position in the sense unit 13 at the time of writing and reading.

The output buffer 31 receives a signal RB for notifying whether or not the state machine 29 is in an operable state, and transmits the state to the ready and busy pin RBn of the NAND-type flash memory 100.

The register circuit 32 stores fuse data read from a fuse area (ROM fuse) of the cell array 11 in a known initialization sequence (not illustrated). In the present embodiment, the register circuit 32 holds data representing a reference voltage (a voltage corresponding to voltage AR, BR, or CR described below) of a word line voltage applied for read.

In addition, the register circuit 32 includes a unit for holding a voltage code applied externally of the NAND-type flash memory 100 by a separate command, and is configured to input the voltage code through a bi-directional bus YIO. In addition, the register circuit 32 outputs, as a fail bit reference value F_NF, an appropriate fail bit reference value from a plurality of fail bit reference values according to a command from the state machine 29. In order to select the proper fail bit reference value, the state machine 29 transmits a signal NFSEL to the register circuit 32.

The fail number count circuit 33 monitors read data stored in a cache included in the sense unit 13, and counts the number of bits and the number of bytes that do not coincide with an expected value at a predetermined timing. Accordingly, the fail number count circuit 33 compares the counted result and the fail bit reference value F_NF output from the register circuit 32. The fail number count circuit 33 notifies the state machine 29 of information by a signal PASS set to a high level when the compared result is equal to or lower than a reference value and by a signal PASS set to a low level when the compared result exceeds the reference value.

1-1-2 Configuration of Cell Array 11

Figure 3:
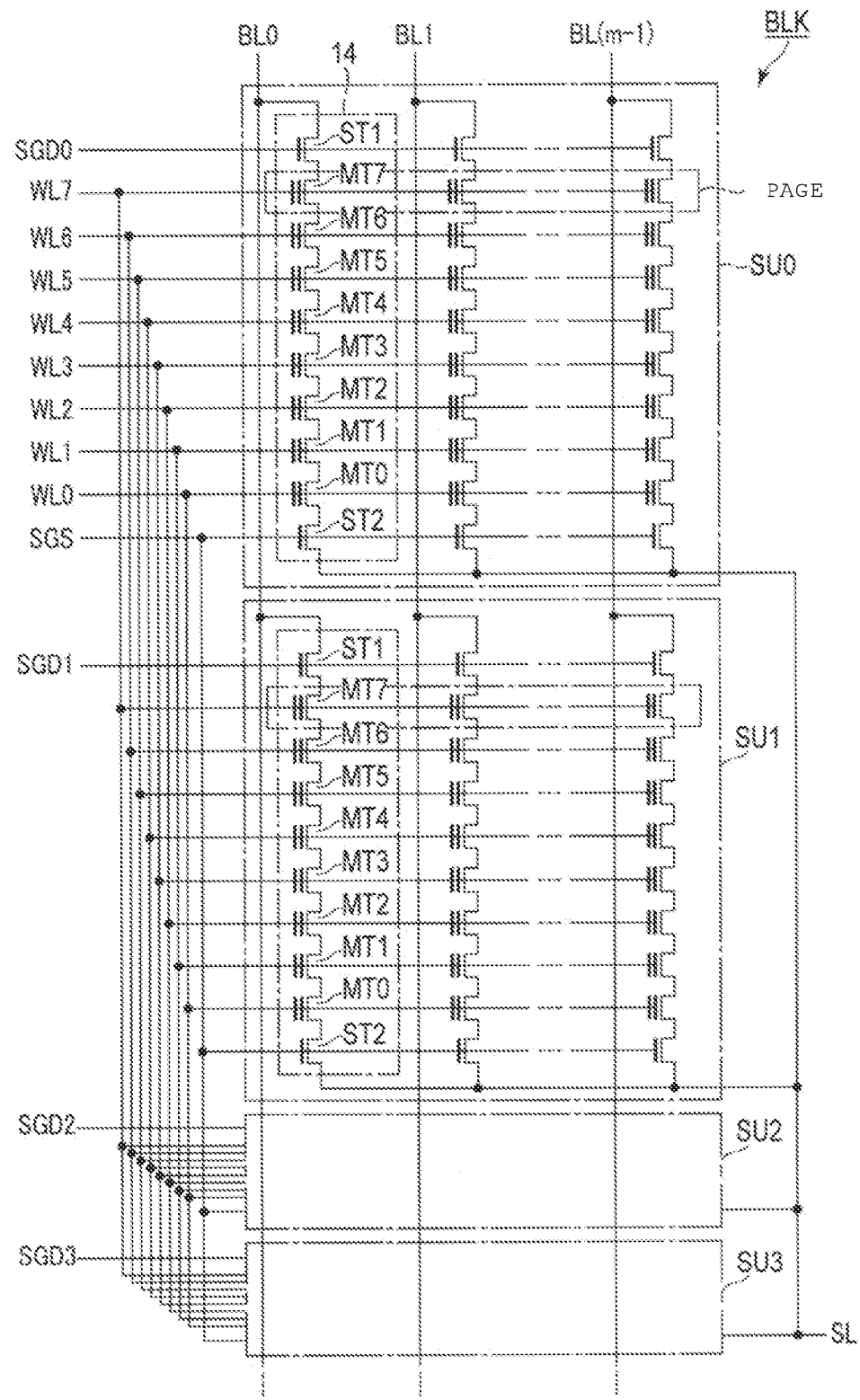
FIG. 3 is a circuit diagram of a cell array.

A configuration of the cell array 11 will be described using FIG. 3. The cell array 11 includes a plurality of blocks BLK. A circuit diagram of a block BLK included in the cell array 11 is illustrated in FIG. 3.

The block BLK includes a plurality of string units SU. Each of the plurality of string units SU includes a plurality of NAND strings 14. In FIG. 3, four string units (SU0, SU1, SU2, and SU3) are illustrated as an example. The number of string units SU can be arbitrarily set within the block BLK.

Each of the plurality of NAND strings 14 includes a plurality of memory cell transistors MT and two selection transistors ST1 and ST2. In some contexts, the memory cell transistor MT may also be referred to as "a memory cell" or "a cell." FIG. 3 illustrates a configuration example in which the NAND string 14 includes eight memory cell transistors MT (MT0, MT1, MT2, MT3, MT4, MT5, MT6, and MT7). However, the number of the memory cell transistors MT included in the NAND string 14 can be arbitrarily set. The memory cell transistors MT include a gate stack having a control gate and a charge storage layer, and stores data in a nonvolatile manner. The plurality of memory cell transistors MT are arranged between the selection transistors ST1 and ST2 so as to connect a current path thereof in series. A current path of the memory cell transistor MT on one end of the series connection is connected to a current path of the selection transistor ST1, and a current path of the memory cell transistor MT in the other end of the series connection is connected a current path of the selection transistor ST2.

Gates of a plurality of the selection transistors ST1 included in the string unit SU0 are commonly connected to a selection gate line SGD0. Similarly, selection gate lines SGD1 to SGD3 are connected to the string units SU1 to SU3, respectively. Gates of a plurality of the selection transistors ST2 within the same block BLK are commonly connected to a selection gate line SGS. The selection transistor ST2 included in each string unit SU may instead be connected to separate selection gate lines SGS0 to SGS3, similar to the selection transistor ST1, in some embodiments. Control gates of the memory cell transistors MT0 to MT7 in the same block BLK are connected to word lines WL0 to WL7, respectively.

The NAND string 14 may include a dummy cell transistor (not specifically depicted). The dummy cell transistors are connected in series between the selection transistor ST1 and the memory cell transistors MT, and between the selection transistor ST2 and the memory cell transistors MT. A gate of the dummy cell transistor is connected to a dummy word line. A structure of the dummy cell transistor is the same as that of the memory cell transistor MT. The dummy cell transistor, which is not used for storing data, has a function for alleviating disturbances applied to the memory cell transistors MT and the selection transistors ST1 and ST2 during a write pulse applying operation or an erasing pulse applying operation.

A current path of the selection transistor ST1 in the plurality of the NAND strings 14 that are in the same column in the matrix of the cell array 11 is connected to one of the bit lines BL 0 to BL (m−1). Here, "m" is an integer equal to or greater than one. That is, one bit line BL connects the NAND strings 14 that are in the same column among a plurality of blocks BLK. The current path of the selection transistors ST2 included in the same block BLK are commonly connected to a source line SL. The source line SL, for example, commonly connects the NAND strings 14 among the plurality of blocks.

Data of the plurality of memory cell transistors MT that are within the same block BLK can be collectively erased. The reading and writing of data is collectively performed on the plurality of memory cell transistors MT commonly connected to one word line WL in one block BLK. This collective data unit is referred to as "a page" or "a page unit."

A configuration of a memory cell array is described in, for example, "THREE DIMENSIONAL STACKED NON-VOLATILE SEMICONDUCTOR MEMORY" of U.S. patent application Ser. No. 12/407,403, filed on Mar. 19, 2009. In addition, the configuration is described in "THREE DIMENSIONAL STACKED NONVOLATILE SEMICONDUCTOR MEMORY" of U.S. patent application Ser. No. 12/406,524, filed on Mar. 18, 2009, "NONVOLATILE SEMICONDUCTOR STORAGE DEVICE AND METHOD OF MANUFACTURING THE SAME" of U.S. patent application Ser. No. 12/679,991, filed on Mar. 25, 2010, and "SEMICONDUCTOR MEMORY AND METHOD FOR MANUFACTURING SAME" of U.S. patent application Ser. No. 12/532,030, filed on Mar. 23, 2009. The entire contents of these patent applications are incorporated herein by reference.

In addition, the erasing of data can be performed in a block BLK unit basis or a unit basis smaller than the block BLK. An erasing method is described in, for example, "NONVOLATILE SEMICONDUCTOR MEMORY DEVICE" of U.S. patent application Ser. No. 13/235,389, filed on Sep. 18, 2011. In addition, the erasing method is described in "NONVOLATILE SEMICONDUCTOR STORAGE DEVICE" of U.S. patent application Ser. No. 12/694,690, filed on Jan. 27, 2010, and "NONVOLATILE SEMICONDUCTOR MEMORY DEVICE AND DATA ERASE METHOD THEREOF" of U.S. patent application Ser. No. 13/483,610, filed on May 30, 2012. The entire contents of these patent applications are incorporated herein by reference.

1-1-3 Configuration of Sense Unit 13

Figure 4:
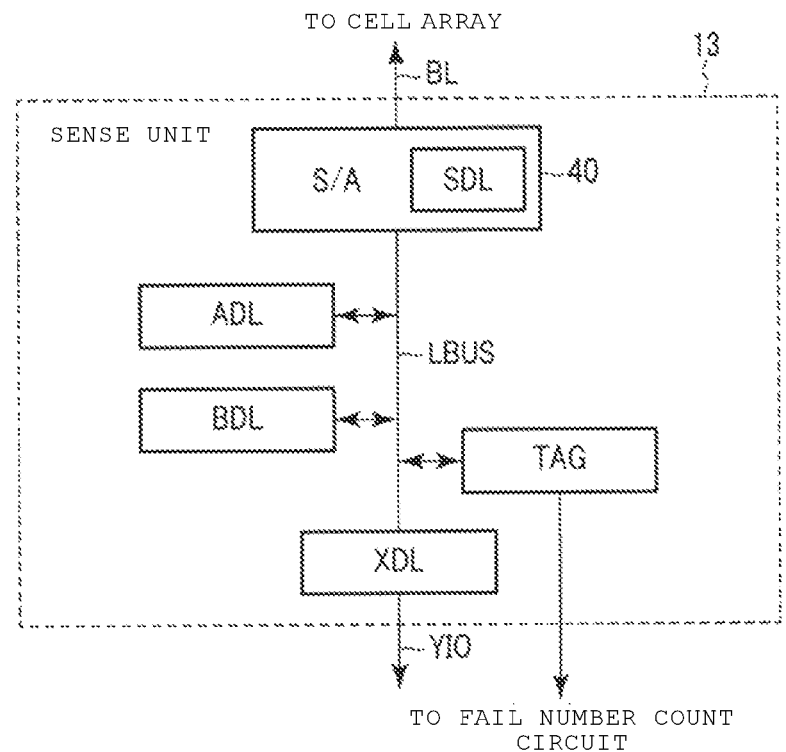
FIG. 4 is a block diagram of a sense unit.

FIG. 4 illustrates a block diagram of the sense unit 13. The sense unit 13 includes a sense amplifier (S/A) 40, three caches (referred as to data cache or data latch circuit) ADL, BDL, and XDL, and a memory node TAG. The memory node TAG, for example, is comprised by a latch circuit.

The caches ADL, BDL, and XDL, and the memory node TAG can temporarily store data. Here, the cache XDL is arranged at the closest position to an IO pad (circuit), and connected to the IO pad by the bi-directional bus YIO. The cache XDL is connected to the sense amplifier 40, the caches ADL and BDL, and the memory node TAG through an internal bus LBUS. Write data or the like stored in the cache XDL can be copied and transferred to the caches ADL and BDL, and the memory node TAG through the internal bus LBUS. The caches ADL and BDL have no particular limitation on a physical positioning thereof, and the positions may be varied. The memory node TAG is arranged to be accessed by the fail number count circuit 33.

The sense amplifier 40 includes the cache (sense amplifier cache) SDL for holding a result obtained at the time of reading. Read data or the like stored in the cache SDL can be copied and transferred to the caches ADL and BDL and the memory node TAG through the internal bus LBUS.

The sense unit 13 is connected to the memory cells through the bit line BL, and has a capacity corresponding to the unit basis (for example, 32 Kbytes) that can be simultaneously read. Specifically, when 32 Kbytes can be simultaneously read, the bit lines BL hold 32,768 bytes (that is, 262,144 bits), and the caches SDL, ADL, BDL, and XDL are provided with same storage capacity.

1-1-4 Configuration of Sense Amplifier 40

Figure 5:
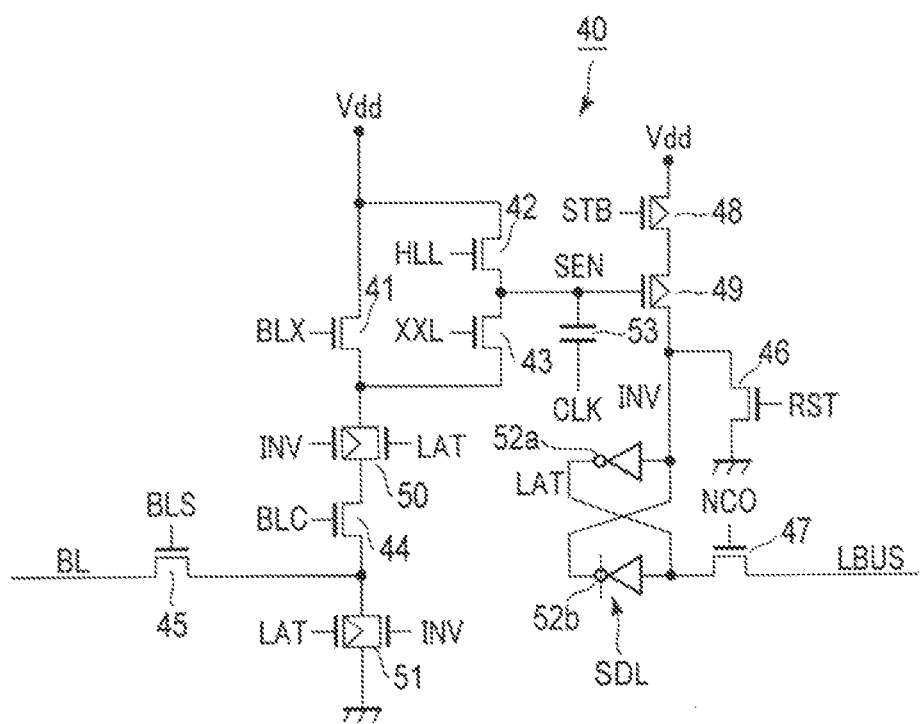
FIG. 5 is a circuit diagram of a sense amplifier.

FIG. 5 illustrates a circuit diagram of the sense amplifier 40.

The sense amplifier 40 includes a plurality of N channel MOS transistors (hereinafter, referred to as NMOS) 41 to 47, a plurality of P channel MOS transistors (hereinafter, referred to as PMOS) 48 and 49, transfer gates 50 and 51, a cache (data latch circuit) SDL, and a capacitor 53. The cache SDL, for example, is configured by clocked inverter circuits 52a and 52b.

One end of a current path of the NMOS 41 is connected to a node to which a power supply voltage Vdd is supplied. The other end of a current path of the NMOS 41 is grounded ("grounded" here means connected to a node to which voltage Vss is supplied, for example) through the transfer gate 50, the NMOS 44, and the transfer gate 51. One end of a current path of the NMOS 45 is connected to a connection node between the NMOS 44 and the transfer gate 51. The other end of the NMOS 45 is connected to the bit line BL arranged in the cell array 11. The NMOS 41 is connected in parallel to a series circuit of the NMOS 42 and the NMOS 43.

One end of a current path of the PMOS 48 is connected to a node to which the power supply voltage Vdd is supplied. The other end of a current path of the PMOS 48 is connected to an input terminal of the inverter circuit 52a configuring the cache SDL through the PMOS 49, and grounded through an NMOS 46. An input terminal of the clocked inverter circuit 52b is coupled to the inverter circuit 52a in a cross-coupled manner and connected to the internal bus LBUS through the NMOS 47. A gate of the PMOS 49 is connected to a connection node between the NMOS 42 and the NMOS 43 through the sense node SEN, and connected to one end of the capacitor 53. A clock signal CLK is supplied to the other end of the capacitor 53.

The state machine 29 supplies various control signals (for example, signals BLX, BLC, BLS, HLL, XXL, STB, RST, and NCO) to the sense amplifier 40.

The signal BLX is supplied to a gate of the NMOS 41. A signal LAT of an output terminal of the inverter circuit 52a configuring the cache SDL is supplied to a gate of an NMOS transistor in the transfer gate 50. A signal INV of an input terminal of the inverter circuit 52a is supplied to a gate of a PMOS transistor in the transfer gate 50. The signal BLC is supplied to a gate of the NMOS 44. The signal BLS is supplied to a gate of the NMOS 45.

The signal INV is also supplied to a gate of an NMOS transistor in the transfer gate 51. The signal LAT is also supplied to a gate of a PMOS transistor in the transfer gate 51.

The signal HLL is supplied to a gate of the NMOS 42. The signal XXL is supplied to a gate of the NMOS 43. The signal STB is supplied to a gate of the PMOS 48. A reset signal RST is supplied to a gate of the NMOS 46. The signal NCO is supplied to a gate of the NMOS 47.

Next, a write operation, a read operation, and a write verification operation in the sense amplifier 40 will be schematically described.

Write Operation

When data is written in the memory cell, the state machine 29 generates a control signal as follows. First, the state machine 29 sets the signal STB to a high level (hereinafter, described as "H" level), sets the reset signal RST to the H level once, and resets the cache SDL. With this, the signal LAT of the cache SDL becomes the H level and the signal INV becomes a low level (hereinafter, described as "L" level).

Then, the state machine 29 sets the signal NCO to the H level. With this, data from the internal bus LBUS is supplied to the cache SDL. When the data is the L level ("0") indicating writing, the signal LAT becomes the L level and the signal INV becomes the H level. In addition, when the data is the H level ("1") indicating non-writing, data of the cache SDL does not change, and the signal LAT is maintained at the H level and the signal INV is maintained at the L level.

Subsequently, the state machine 29 sets the signals BLX, BLC, and BLS to the H level. Then, when writing (that is, when the signal LAT of the cache SDL is the L level and the signal INV is the H level), the transfer gate 50 is turned off, and the transfer gate 51 is turned on, whereby the voltage of the bit line BL becomes the ground voltage Vss. In this state, when a voltage of the word line becomes a program voltage Vpgm, data is written in the memory cell.

Meanwhile, in the case of non-writing (that is, when the signal LAT of the cache SDL is the H level and the signal INV is the L level), the transfer gate 50 is turned on and the transfer gate 51 is turned off, whereby the bit line BL is charged to the power supply voltage Vdd. Here, when the word line becomes the program voltage Vpgm, a channel of the memory cell is raised to a higher potential, and thus data is not written in the memory cell.

Read Operation and Write Verification Operation

When data is read from the memory cell, the state machine 29 generates a control signal (or signals) as follows. First, the state machine 29 sets the reset signal RST to the H level once, and resets the cache SDL. With this, the signal LAT of the cache SDL becomes the H level and the signal INV becomes the L level.

Then, the state machine 29 sets the signals BLS, BLC, BLX, HLL, and XXL to a predetermined voltage. With this, the bit line BL is charged and a node SEN of the capacitor 53 is charged to the power supply voltage Vdd. Here, when a threshold voltage of the memory cell is higher than a read level, the memory cell is in a turned off state and the bit line BL is held at the H level. That is, the node SEN is held at the H level. In addition, when the threshold voltage of the memory cell is lower than the read level, the memory cell is in a turned on state and charge of the bit line BL is discharged. Therefore, the bit line BL becomes the L level. With this, the node SEN also becomes the L level.

In addition, the state machine 29 sets the signal STB to the L level. Then, when the memory cell is turned on, since the node SEN is in the L level, the PMOS 49 is turned on. With this, the signal INV of the cache SDL becomes the H level and the signal LAT becomes the L level. On the other hand, when the memory cell is turned off, since the node SEN is in the H level, the PMOS 49 is turned off. With this, the signal INV of the cache SDL is held at the L level and the signal LAT is held at the H level. In this manner, a sense operation is performed by setting the signal STB to the L level, and the data from the memory cell can be read.

Then, the state machine 29 sets the signal NCO to the H level. Then, the NMOS 47 is turned on and data of the cache SDL is transmitted to the internal bus LBUS.

After a write operation, a write verification operation for verifying a threshold voltage of the memory cell is performed. The write verification operation is the same as the read operation.

1-1-5 Threshold of Memory Cell Transistor

Figure 6:
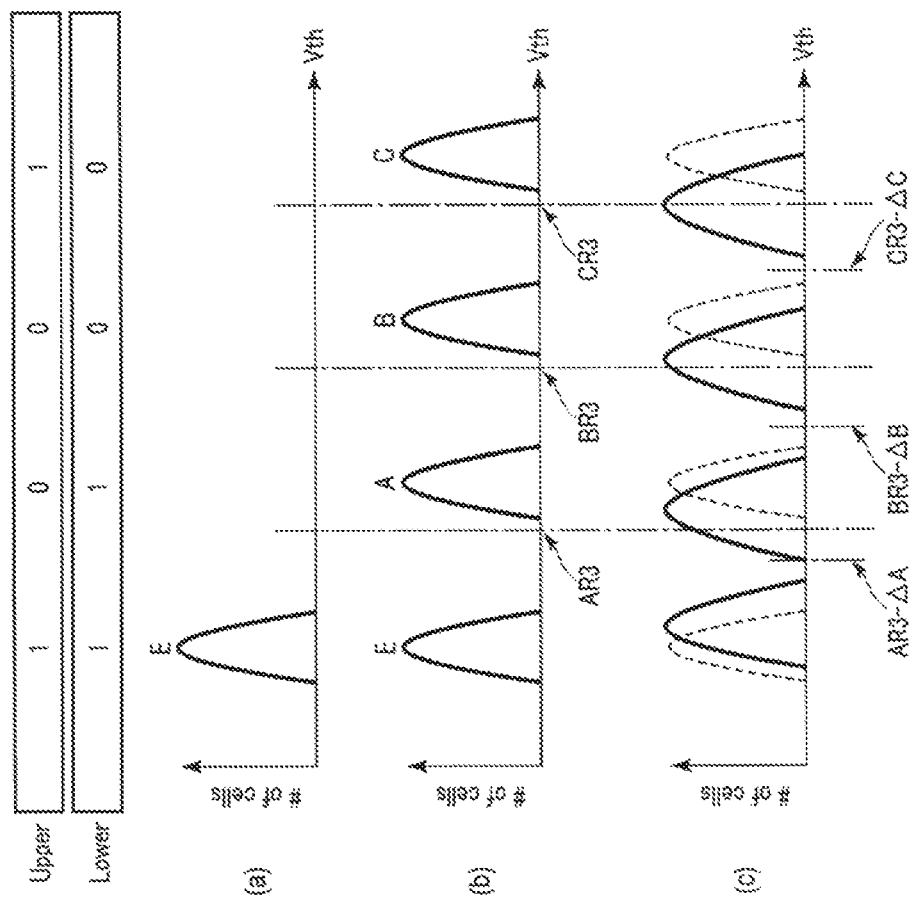
FIG. 6 is a diagram illustrating aspects of an assignment of a threshold and data of a memory cell transistor.

FIG. 6 is a diagram for explaining distribution of a threshold voltage and data of the memory cell transistor. A horizontal axis in FIG. 6 is the threshold (threshold voltage) of the memory cell transistor and a vertical axis in FIG. 6 is the number of the memory cell transistors. The memory cell transistor can store two-bit data (four values).

The least significant bit (LSB) is represented as a "Lower" value and the most significant bit (MSB) is represented as an "Upper" value. The two-bit data corresponding to a lower page as a first page and an upper page as a second page is written in the memory cell. One of the values "11", "01", "00", and "10" can be stored in the memory cell.

From the lower of the threshold voltage levels of the memory cell, the depicted curves are referred as an "E" level (erasing level), an "A" level, a "B" level, and a "C" level. The "E" level, the "A" level, the "B" level, and the "C" level correspond to data "11", "10", "00", and "01", respectively. However, the present embodiment is not limited to a memory cell having just four values. The present embodiment can be also similarly applied to a memory cell of two values, eight values, sixteen values, or the like.

Portion (a) of FIG. 6 illustrates a threshold voltage state before storing data in the memory cells. Here, the memory cells have threshold voltages that are within the distribution of the erasing level ("E" level).

Threshold voltage distribution(s) of the memory cells after writing two-bit data is illustrated as portion (b) of FIG. 6. The lower page can be read by applying a read level BR3 to the word line and the upper page can be read by applying a read level AR3 and a read level CR3 to the word line. The read levels AR3, BR3, and CR3 are held in registers arranged in the register circuit 32 illustrated in FIG. 2, and a required voltage is applied to the memory cells with reference to appropriate register values at the time of reading.

However, there is a case where the NAND-type flash memory 100 stores data over a long period of time after writing in a nonvolatile manner, and then the data is read after this long period of time. During the storage date for the long period of time, a part of the charges accumulated in a charge storage layer of the memory cells may disappear or be dissipated. As a result, the threshold voltage distribution previously set may be changed. For example, there is a case as depicted in portion (c) of FIG. 6.

In this case, since an error would occur when reading is performed at the read levels AR3, BR3, and CR3 described above, reading at proper or corrected read levels AR3−ΔA, BR3−ΔB, and CR3−ΔC is required. This present embodiment discloses a solution in view of this aspect.

1-2 Operation

Figure 7:
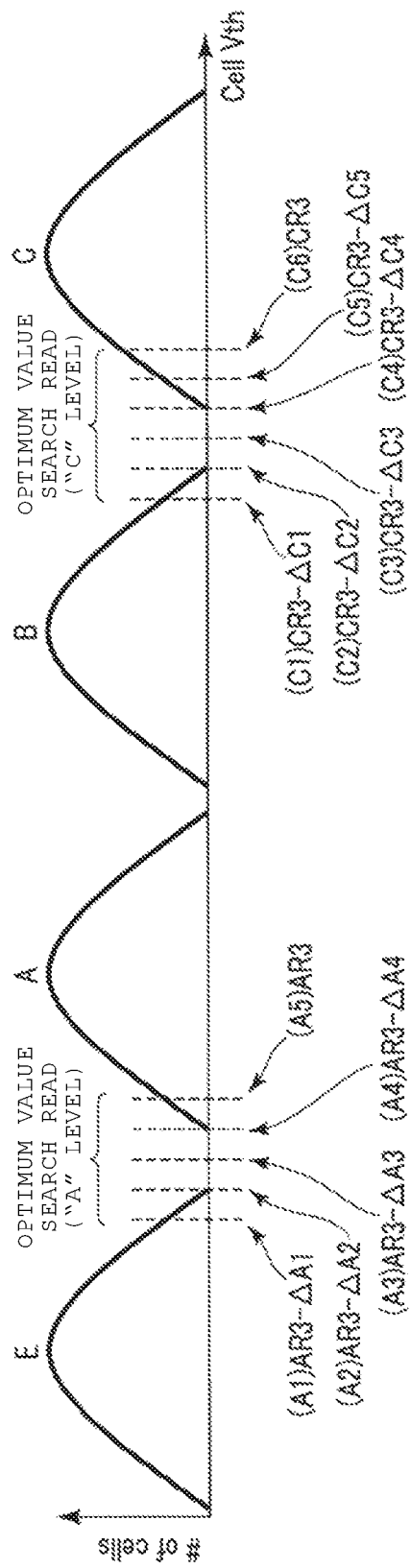
FIG. 7 is a diagram illustrating aspects of a read level according to an embodiment.

FIG. 7 is a diagram for explaining an example of a plurality of read levels. Here, an example is illustrated in which a state corresponding to the depiction of portion (c) of FIG. 6 has been obtained—that is, the threshold voltage distribution of the memory cells is changed due to long-term storage of data and data cannot be precisely read at initial read levels AR, BR, and CR. Changes in the threshold voltage distribution may be different according to the particular threshold voltage level. However, in this present embodiment, it is assumed that downshift of all of distributions levels occurs toward a lower threshold value, that is, toward an "E" level direction. It is expected that directions and amounts the shift may be different according to a structure and film composition of the memory cell(s). However, the direction of the shift can be realized in applications described below.

The particular values of AR3 of (A5) and CR3 of (C6) illustrated in FIG. 7 are read levels of an "A" level distribution and a "C" level distribution that are stored in the register circuit 32, respectively. When there is no change of the threshold voltage distribution over long-term storage, it is possible to perform reading at these levels.

In this present embodiment, since the downshift in the threshold voltage occurs, reading is performed at four read levels (A1), (A2), (A3), and (A4), that are each relatively lower than an AR3(A5) level, and at the original read level (A5)AR3 of the "A" level distribution, and similarly reading is performed at five read levels (C1), (C2), (C3), (C4), and (C5) each relatively lower than a (C6)CR3 level, and at the original read level (C6)CR3 of the "C" level distribution.

Although here reading is still performed at the original read levels (A5) and (C6), in some embodiments reading at these original levels may be omitted as unnecessary. The reading at the five levels relatively lower than the "A" level distribution and in the six levels relatively lower than the "C" level distribution may be performed. In addition, here the number of times the reading is five and six in an "A" level and a "C" level, respectively. However, a circuit may be configured to realize the other number of times of the reading that might be necessary.

The read levels (selected word line voltage) for the "A" level distribution can be calculated according to the following relationships:

$$AR3-A\_DELTA \times 4 = AR3 - \Delta A1 \quad (A1):$$

$$AR3-A\_DELTA \times 3 = AR3 - \Delta A2 \quad (A2):$$

$$AR3-A\_DELTA \times 2 = AR3 - \Delta A3 \quad (A3):$$

$$AR3-A\_DELTA \times 1 = AR3 - \Delta A4 \quad (A4):$$

$$AR3. \quad (A5):$$

The read levels (selected word line voltage) for the "C" level distribution can be calculated according to the following relationships:

$$CR3-C\_DELTA \times 5 = CR3 - \Delta C1 \quad (C1):$$

$$CR3-C\_DELTA \times 4 = CR3 - \Delta C2 \quad (C2):$$

$$CR3-C\_DELTA \times 3 = CR3 - \Delta C3 \quad (C3):$$

$$CR3-C\_DELTA \times 2 = CR3 - \Delta C4 \quad (C4):$$

$$CR3-C\_DELTA \times 1 = CR3 - \Delta C5 \quad (C5):$$

$$CR3. \quad (C6):$$

The reading from (A1) read level to (A5) read level may be called an "A" level optimum value search read, and the reading from (C1) read level to (C6) read level may be called a "C" level optimum value search read. Collectively, the reading of the (A1) level read level to the (A5) read level along with the reading of the (C1) read level to the (C6) read level may be simply referred to as an "optimum value search read." Furthermore, an "A" level is the read level that is determined to be the optimum level from among the (A1) to (A5) read levels and a "C" level read is the read level that is determined to be the optimum level from among the (C1) to (C6) read levels. The "A" level read and the "C" level read are collectively called a "search read." Reading at a read level that is determined to be optimum from the (A1) to the (A5) read levels is called an "A" level optimum value read, and reading at a read level that is determined to be optimum from the (C1) to the (C6) read levels is called a "C" level optimum value read.

The value A_DELTA is a variable value for applying each difference in the "A" level optimum value search read and the value C_DELTA is a variable value for applying each difference of the "C" level optimum value search read. These values (A_DELTA and C_DELTA) are stored in the register circuit 32 of FIG. 2. As described further, it may be preferable that A_DELTA and C_DELTA values are configured to be arbitrarily designated externally from the NAND-type flash memory 100. For example, a case where a value previously determined for a circuit is stored or a value, in general, is stored in a ROM fuse or the like, may be implemented.

The following description can also be applied in a read operation of "B" level distribution, similarly.

1-2-1 Optimum Value Search Read and Optimum Value Read

Figure 8:
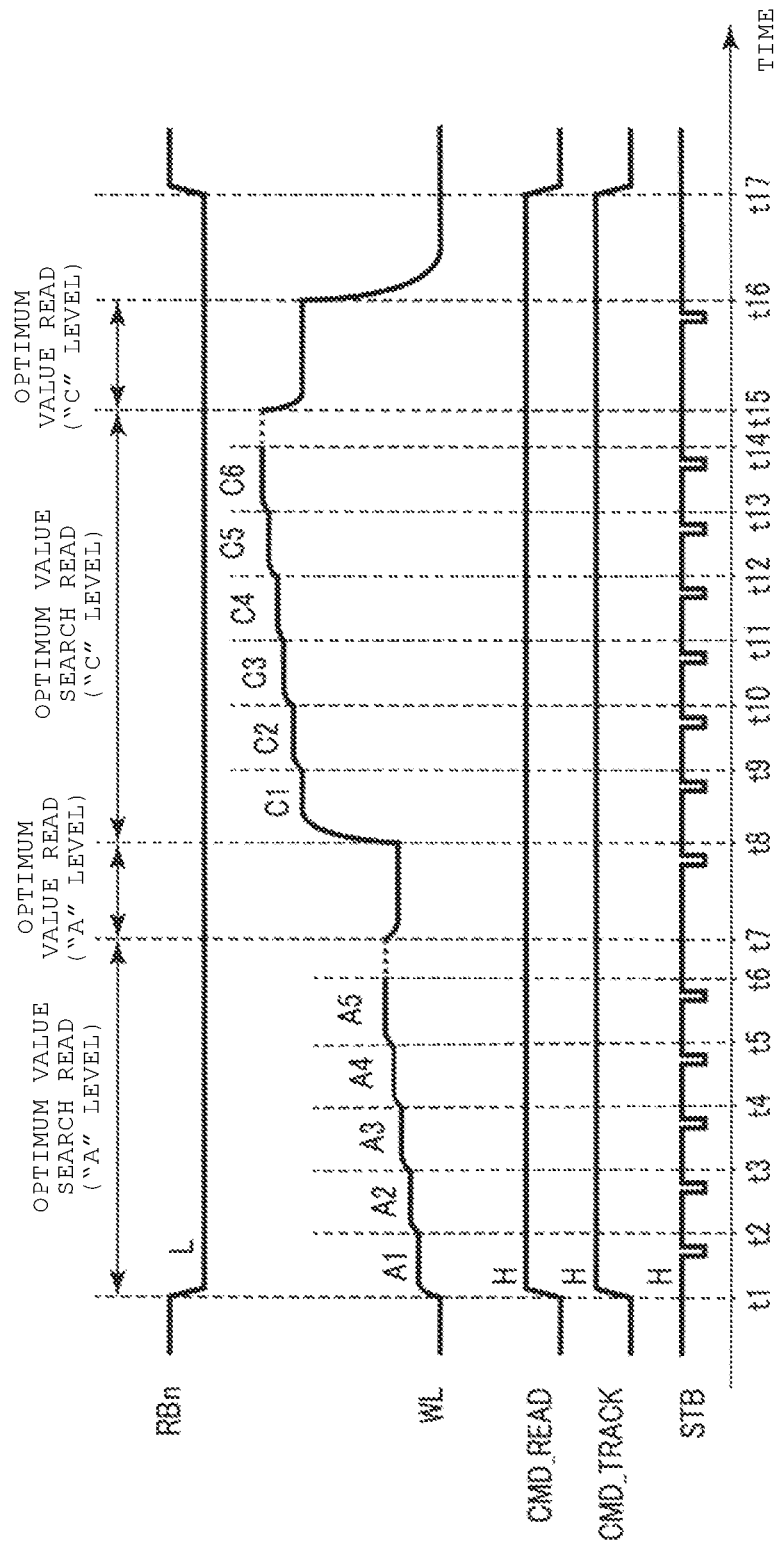
FIG. 8 is a diagram illustrating aspects of read sequence in search read.

FIG. 8 is a diagram for explaining a read sequence including the optimum value search read and the optimum value read. A horizontal axis of FIG. 8 represents time. The RBn value (signal) illustrated in FIG. 8 is the output level of a pin (ready and busy pin) RBn of the NAND-type flash memory 100. As described in FIG. 5, the value (signal) STB illustrated in FIG. 8 corresponds to a signal used when reading data.

Until a time t1, execution commands and addresses for performing the search read are input from the memory controller 200 to the NAND-type flash memory 100. When the execution command is received from the memory controller 200, the NAND-type flash memory 100 changes the ready and busy pin RBn value to a low level to indicate a busy state. According to the operation, with reference to FIG. 2, the state machine 29 recognizes that the signal CMD_TRACK is changed to the high level and the signal CMD_READ is changed to the high level, and the search read starts. When reading is to be performed at a single AR3 level and a single CR3 level without performing the search read, this reading is distinguished from the search read by setting the signal CMD_TRACK to the low level and the signal CMD_READ to the high level.

At a time t1, generation of a voltage required within a device starts, and a word line voltage required for the (A1) read is calculated and the calculated voltage is applied to the selected word line. A result thereof is stored in a predetermined cache of the sense unit 13 by a predetermined method, such as in a method described below.

At a time t2, the (A2) read is performed at a read level different from the (A1) read. A result thereof is stored in a predetermined cache by a predetermined method, similar to that of the read at the time t1. Then, the "A" level optimum value search read is completed by sequentially performing the (A3) read, the (A4) read, and the (A5) read at a time t3, a time t4, and a time t5, respectively.

At a time t6, an optimum read level to be used in the "A" level optimum value read is calculated from, or otherwise selected using, the read results from the (A1) read to the (A5) read.

At a time t7, the "A" level optimum value read is performed. That is, reading is performed with the calculated optimum value and a result thereof is stored in a predetermined cache by a predetermined method.

At a time t8, the "C" level optimum value search read starts. Specifically, the word line voltage required for the (C1) read is calculated and this calculated voltage is applied to the selected word line. A method for storing a result thereof is the same as the case of the "A" level reading. The same operation is also repeated at times t9, t10, t11, t12, and t13 for reads (C2) to (C6).

At a time t14, an optimum word line voltage to be used in the "C" level optimum value read is calculated from, or otherwise selected using, the read results of the (C1) read to the (C6) read.

At a time t15, the "C" level optimum value read is performed. That is, reading at the calculated optimum value is performed, and a result thereof is stored in a predetermined cache by a predetermined method. Any required calculation with respect to the stored result and a result of the previous "A" level optimum value read is performed, and a result thereof is provided for outputting to outside of the device by storing the result in the cache XDL.

At a time t16, at which reading is completed, the state machine 29 performs an operation of discharging the word line by using a known method. At a time t17, the state machine 29 sets the ready and busy pin RBn to the high level, and notifies the memory controller 200 of the completion of the reading. Then, the state machine 29 outputs the data by a predetermined method. Here, control such as the calculation of the selected word line voltage required for reading and voltage application to the memory cell is mainly performed by the state machine 29 and also the memory cell control register 30, which receives commands from the state machine 29 and performs control in cooperation with the state machine 29.

Figure 9:
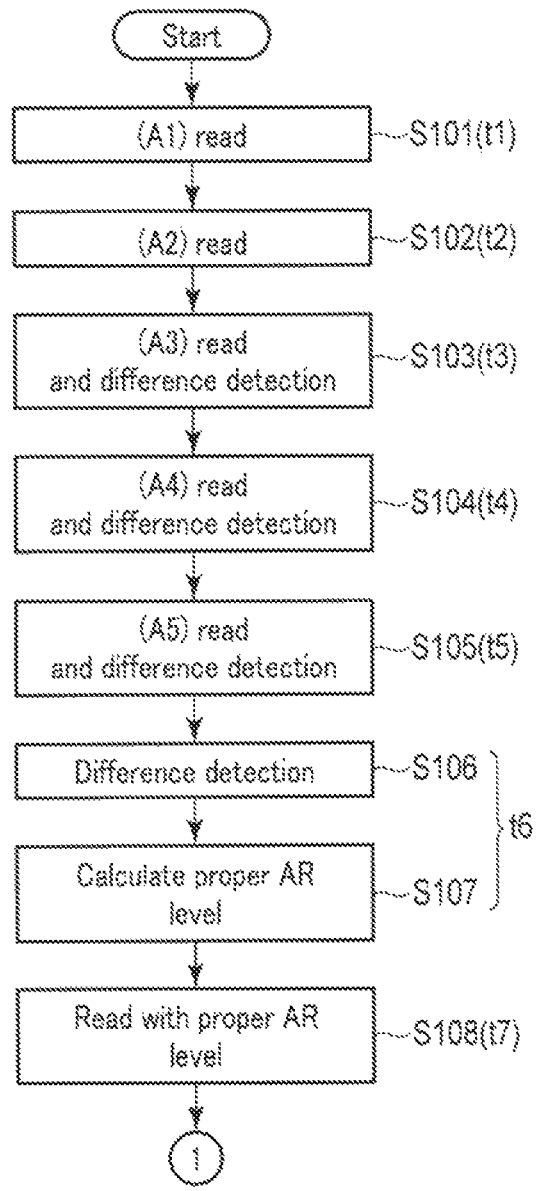
FIG. 9 is a flow chart illustrating aspects of an operation of a state machine.
Figure 10:
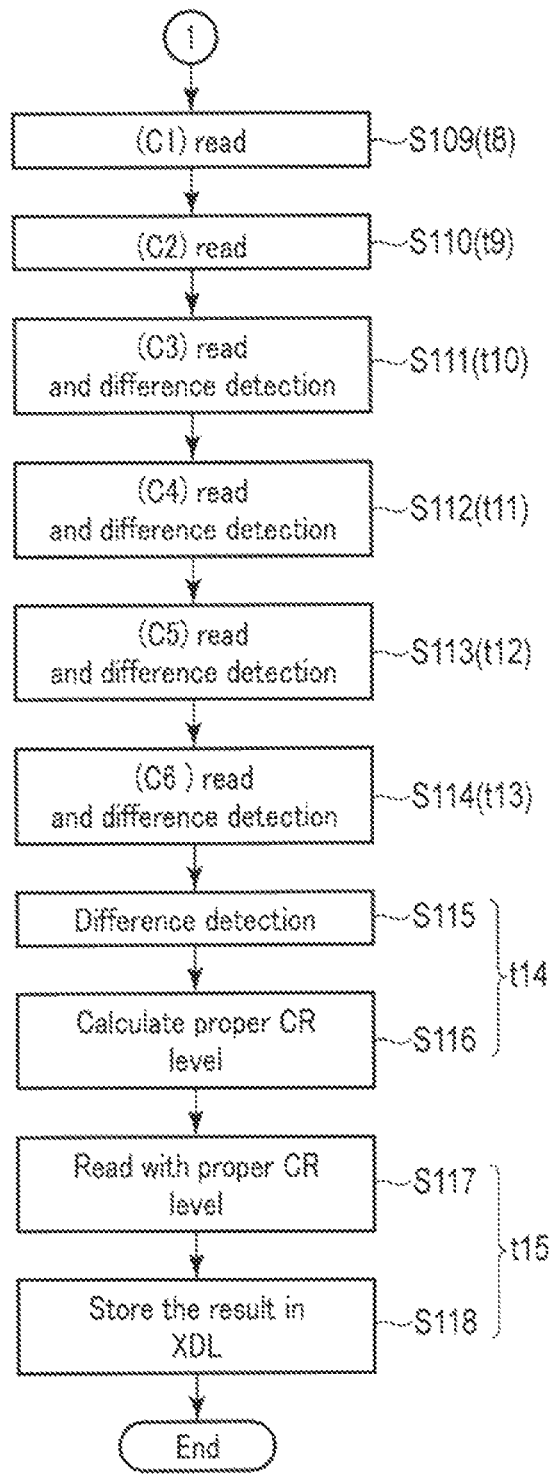
FIG. 10 is a flow chart illustrating other aspects of the state machine.

Next, an operation flow controlled by the state machine 29 will be described. FIG. 9 and FIG. 10 are flow charts for explaining aspects of operations of the state machine 29.

The state machine 29 performs the (A1) read (step S101) Step S101 corresponds to an operation from time t1 to time t2 in FIG. 8.

The state machine 29 performs the (A2) read (step S102) Step S102 corresponds to an operation from time t2 to time t3 in FIG. 8.

The state machine 29 performs the (A3) read (step S103) Step S103 corresponds to an operation from time t3 to time t4 in FIG. 8. Furthermore, in step S103, the state machine 29 extracts (performs difference extraction on) the memory cells having a threshold voltage between (A1) and (A2) using the read results from step S101 and step S102, and counts (performs difference detection) to determine the number of the memory cells which have a threshold voltage between (A1) and (A2).

The state machine 29 performs the (A4) read (step S104). Step S104 corresponds to an operation from time t4 to time t5 in FIG. 8. Furthermore, in step S104, the state machine 29 extracts (performs difference extraction on) the memory cells having a threshold voltage between (A2) and (A3) using the read results from step S102 and step S103, and counts to determine the number of the memory cells which have a threshold voltage between (A2) and (A3).

The state machine 29 performs the (A5) read (step S105). Step S105 corresponds to an operation from time t5 to time t6 in FIG. 8. Furthermore, in step S105, the state machine 29 extracts the memory cells having a threshold voltage between (A3) and (A4) using the read results from step S103 (and before) and step S104, and counts to determine the number of the memory cells which have a threshold voltage between (A3) and (A4).

Similarly, the state machine 29 extracts the memory cells having a threshold voltage between (A4) and (A5) from a read result from step S104 (and before) and a read result from step S105, and counts to determine the number of the memory cells which have a threshold voltage between (A5) and (A6) (step S106). In step S107, the state machine 29 then calculates an optimum read level (AR level) for reading the "A" level by using the results from up to (and including) step S106. An example of algorithm for calculating the optimum read level will be described below. The state machine 29 stores the optimum read level calculated in step S107 in the register circuit 32. Step S106 and step S107 correspond to an operation from time t6 to time t7 in FIG. 8.

In step S108, the state machine 29 performs the "A" level optimum value read by using the AR level calculated in step S107. Step S108 corresponds to an operation from time t7 to t8 in FIG. 8.

"C" Level

The state machine 29 performs the (C1) read (step S109). Step S109 corresponds to an operation from time t8 to time t9 in FIG. 8.

The state machine 29 performs the (C2) read (step S110) Step S110 corresponds to an operation between from time t9 to time t10 in FIG. 8.

The state machine 29 performs the (C3) read (step S111) Step S111 corresponds to an operation from time t10 to time t11 in FIG. 8. Furthermore, in step S111, the state machine 29 extracts the memory cells having a threshold voltage between (C1) and (C2) using read results from step S109 and step S110, and counts the number of the memory cells having a threshold voltage between (C1) and (C2).

The state machine 29 performs the (C4) read (step S112) Step S112 corresponds to an operation from time t11 to time t12 in FIG. 8. Furthermore, in step S112, the state machine 29 extracts the memory cells having a threshold voltage between (C2) and (C3) from a read result of step S110 (and step S109) and a read result of step S111, and counts the number of the memory cells having a threshold voltage between (C2) and (C3).

The state machine 29 performs the (C5) read (step S113) Step S113 corresponds to an operation from time t12 to time t13 in FIG. 8. Furthermore, in step S113, the state machine 29 extracts the memory cell having a threshold voltage between (C3) and (C4) from a read result of step S111 (and before) and a read result of step S112, and counts the number of the memory cells having a threshold voltage between (C3) and (C4).

The state machine 29 performs the (C6) read (step S114) Step S114 corresponds to an operation from time t13 to time t14 in FIG. 8. Furthermore, in step S114, the state machine 29 extracts the memory cell having a threshold voltage between (C4) and (C5) from a read result of step S112 (and before) and a read result of step S113, and counts the number of the memory cells having a threshold voltage between (C4) and (C5).

In step S115, the state machine 29 extracts the memory cell having a threshold voltage between (C5) and (C6) from a read result of step S113 (and before) and a read result of step S114, and counts the number of the memory cells having a threshold voltage between (C5) and (C6). In step S116, the state machine 29 calculates an optimum read level (CR level) for reading the "C" level by using the results from up to (and including) step S115. An example of calculation algorithm will be described below. The state machine 29 stores an optimum read level calculated in step S116 in the register circuit 32. Step S115 and step S116 correspond to an operation from time t14 to time t15 in FIG. 8.

In step S117, the state machine 29 performs the "C" level optimum value read by using the word line voltage (CR level) calculated in step S116. In step S118, the state machine 29 stores, in the cache XDL, a result obtained by combining a read result of step S117 and the previous result of the "A" level optimum value read of S108. Step S117 and step S118 correspond to an operation from time t15 to time t16 in FIG. 8. By this process, preparation for the output of data is completed.

1-2-2 Operation of Cache

Next, the caching operations will be described. FIG. 11 is a diagram for explaining aspects of the caching operation in the "A" level optimum value search read and the "A" level optimum value read. As depicted in FIG. 11, a word line voltage reference value, a voltage difference, specific contents (XDL contents, ADL contents, and BDL contents) in each cache at an initial, starting time point, a main operation (required operation) relating to caching, contents of result registers (registers PF_1ST, PF_2ND, PF_3RD, and PF_4TH) stored upon step completion are illustrated for every step depicted in FIG. 9 and FIG. 10. Note, the usage of "w/" in FIG. 11 is an abbreviation of "with."

Thus, in the (A1) read of step S101, reading is performed by applying a voltage of "AR3−A_DELTA×4" to the word line ("word line voltage reference value"−"voltage difference"), and a result of this (A1) read is stored in the cache ADL. Since data is undetermined at the start of the reading, a horizontal line "-" is shown in the "ADL contents" column for the S101 row. Similarly, since data in the cache BDL is also undetermined, contents in the result register(s) are also undetermined.

Likewise, as depicted in FIG. 11, for the (A5) read in the step S105, reading is performed by applying a voltage of AR3 (AR3−0 voltage difference) to the word line. At a start step S105, a result from the (A4) read of step S104 (i.e. the step just before step S105) has been stored in the cache ADL and the accumulation of read results up to step S103 are stored in the cache BDL. However, the result in the cache BDL is not necessarily an accumulated value, and in some embodiments the result of step S103 is the stored value. For a result of a read voltage and the threshold voltage distribution, the accumulated result of the former may be adopted when the consistency of a result is not maintained due to noise, and the latter embodiment (non-accumulated results) may be adopted when the effect of noise can be ignored.

Figure 12:
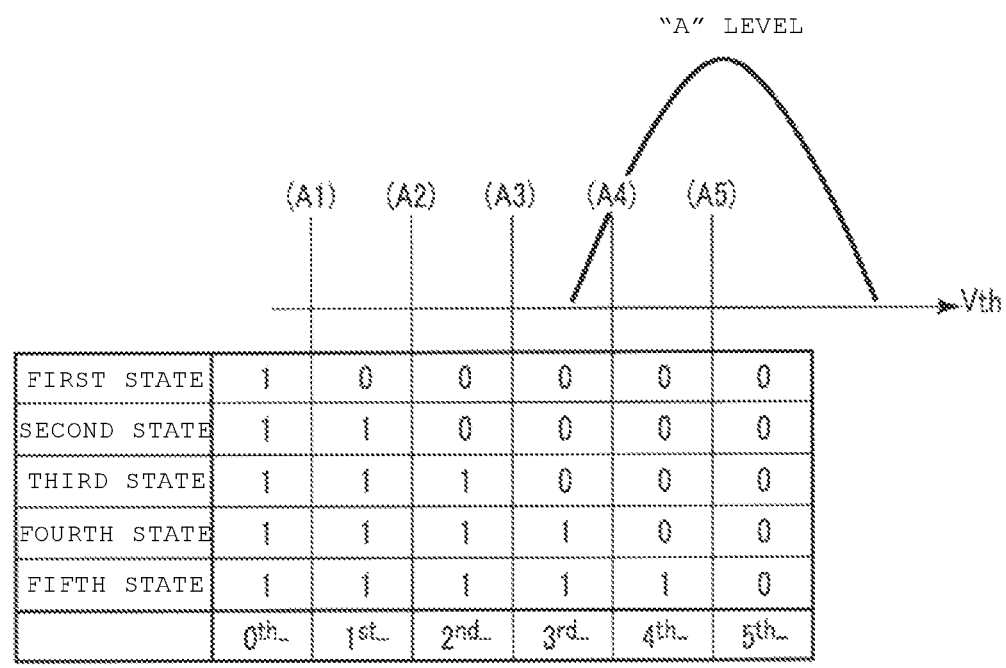
FIG. 12 is a diagram illustrating aspects of an example of data stored in the cache by optimal value search read.

FIG. 12 is a diagram for explaining an example of data stored in the cache ADL in the optimum value search read. FIG. 13 is a diagram for explaining an example of data in the caches SDL, ADL, and XDL, and the memory node TAG from a first state to a fifth state illustrated in FIG. 12. The data values stored in the cache ADL in the first state to the fifth state correspond to results of at (A1) read voltage level to the (A5) read voltage level, respectively. The 0th interval ($0^{th}$-), the 1st interval ($1^{st}$-), the 2nd interval ($2^{nd}$-), the 3rd interval ($3^{rd}$-), the 4th interval ($4^{th}$-), and the 5th interval ($5^{th}$-) represent the intervals separated by the read voltage levels (A1) through (A5).

As illustrated in FIG. 12, data stored in the cache ADL changes according) a threshold voltage of the memory cell(s) being read at the various levels (A1) to (A5). For example, when the threshold voltage of the memory cell is in the 0th interval data "1" is stored in the cache ADL. However, data "0" is stored in the cache ADL when the memory cell has a threshold voltage level higher than the 1st interval ($1^{st}$-). As another example, when reading is performed at the word line voltage at the (A5) read level, data "1" is stored in the cache ADL when the entirety of cells have a threshold voltage in the 0th interval, the 1st interval, the 2nd interval ($2^{nd}$-), the 3rd interval ($3^{rd}$-), and the 4th interval ($4^{th}$-), and data "0" is stored in the cache ADL when all the cells have a threshold voltage in the 5th interval ($5^{th}$-).

A method for accumulating a read result just before it is stored in the cache BDL and a method for updating data latch will be described with reference to FIG. 11 to FIG. 13.

As illustrated in FIG. 11, in the (A1) read of step S101, reading is performed using a value calculated by "AR3−A_DELTA×4" as the word line voltage. In step S101, a sense result is held in the cache SDL. At a reading start time point, data of the cache XDL is not determined (undetermined), and this similarly applies to the caches ADL and BDL. In addition, data is also not determined (undetermined) with respect to the result register. The fact that the data is not determined (undetermined) means that any data may be held in these caches or registers. The required operation "STB" in FIG. 11 corresponds to a determination of data of the cache.

In the (A2) read of step S102, reading is performed by using a value calculated as "AR3−A_DELTA×3" as the word line voltage. At a read start time point, data of the caches XDL, ADL, and BDL are not determined. In addition, data in the result register is also undetermined. In step S102, data of the cache SDL is copied to the cache ADL, and the cache SDL is available for storing a read result of the next (A2) read.

A data state of each cache in step S102 is a first state of FIG. 12 and FIG. 13. When having the first state, a data state of one bit in each memory cell is reflected in the cache ADL. Specifically, data "1" is stored in the cache ADL in a case of the memory cell having a threshold voltage in the 0th interval, and data "0" is stored in the cache ADL in a case of the memory cell having a threshold voltage in the 1st interval or a threshold voltage higher than the 1st interval.

In the (A3) read of step S103, reading is performed by using a value calculated as "AR3−A_DELTA×2" for the word line voltage. At a read start time point, data of the caches XDL and BDL is undetermined. In addition, data is also undetermined with respect to the result register. In step S103, data of the cache ADL is copied to the cache BDL, and a read result of the (A2) read (determined in step S102) is copied from the cache SDL to the cache ADL. At this time point, a data state of each cache is a second state of FIG. 12 and FIG. 13.

The state machine 29 extracts locations at which data are not matched using data of the cache ADL and the cache BDL, and copies data representing non-matching locations to the memory node TAG. Contents of the memory node TAG can be sent to the fail number count circuit 33. Here, by extracting locations at which data are not matched using data of the cache ADL and the cache BDL is to extract bits having different data when reading is performed at the (A1) read level or the (A2) read level. That is, it is possible to count the number of bits of the memory cells having a threshold voltage in the 1st interval by counting the memory cells with a threshold voltage in the 1st interval between (A1) and (A2). This processing is illustrated as "TAG=ADL&/BDL", and "All 0 detection" of FIG. 11.

The fail number count circuit 33 compares the number of locations not matched within the memory node TAG, that is, the number of non-matching bits, and the fail bit reference value F_NF, and, as a comparison result, stores "Fail" in the result register when it is determined that the number of non-matching bits is greater than that of F_NF and stores "Pass" in the result register when it is determined that the number of non-match bits is lower than that of F_NF. A method for holding this comparison result will be described later.

In the (A4) read of step S104, reading is performed by using a value calculated as "AR3−A_DELTA×1" as the word line voltage. At a read start time point, data of the cache XDL is undetermined. A read result of the (A2) read is held in the cache ADL. A read result in the (A1) read is held in the cache BDL and a result counted in step S103 is held in the result register.

In step S104, data of the cache ADL is copied to the cache BDL, the read result of the (A3) read (determined in step S103) is copied from the cache SDL to the cache ADL. At this time point, a data state of each cache is a third state of FIG. 13.

The state machine 29 extracts locations at which data are not matched from data of the cache ADL and the cache BDL, that is, extracts the memory cell having a threshold voltage in the 2nd interval between (A2) and (A3), copies the extracted result to the memory node TAG similar to the previous operation, and performs counting of non-matching bits. Similarly, the counting result is held in the result resister.

In the (A5) read of step S105, reading is performed using the word line voltage AR3. At a read start time point, data of the cache XDL is undetermined. A read result of the (A3) read is held in the cache ADL. A read result in the (A2) read is held in the cache BDL and a counting result of step S104 is held in the result register.

In step S105, data of the cache ADL is copied to the cache BDL. A read result of the (A4) read determined in step S104 is copied from the cache SDL to the cache ADL. At this time point, a data state of each cache is a fourth state of FIG. 13.

The state machine 29 extracts locations at which data are not matched from the data of the cache ADL and the cache BDL, that is, the state machine 29 extracts the memory cells with a threshold voltage in the 3rd interval between (A3) and (A4), copies the extracted result to the memory node TAG similar to the previous operation, and performs counting of non-matching bits. Similarly, the counting result is held in the result resister.

In step S106, the state machine 29 performs counting of the number of fail bits. At an operation start time point, data of the cache XDL is undetermined. A read result of the (A4) read is held in the cache ADL, a read result of the (A3) read is held in the cache BDL, and a result counted in step S105 is held in the result register.

In step S106, data of the cache ADL is copied to the cache BDL, and a read result of the (A5) read determined in step S105 is copied from the cache SDL to the cache ADL. At this time point, a data state of each cache is a fifth state of FIG. 13.

The state machine 29 extracts locations at which data are not matched from data in the cache ADL and the cache BDL, that is, the state machine 29 extracts the memory cells with a threshold voltage in the 4th interval between (A4) and (A5), copies the extracted result to the memory node TAG, similar to the previous operation, and performs counting of non-matching bits. Similarly, the counting result is held in the result resister. At this time point, a data state of each cache is a sixth state of FIG. 13.

1-2-3 Configuration of Register of State Machine

Figure 14:
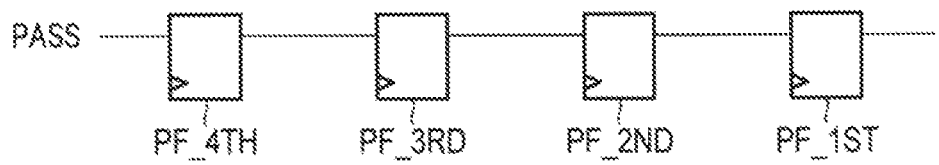
FIG. 14 is a circuit diagram of registers in the state machine.

Next, a method for holding the fail bit reference value F_NF and a comparison result thereof will be described. FIG. 14 is a circuit diagram of registers arranged within the state machine 29.

An output signal PASS of the fail number count circuit 33 is input to the state machine 29, and stored in the registers arranged within the state machine 29. The state machine 29 includes four registers PF_1ST, PF_2ND, PF_3RD, and PF_4TH.

The signal PASS from the fail number count circuit 33 is input to the register PF_4TH of the first stage, and the register PF_4TH holds and outputs data of the signal PASS at a clock timing. Output of the register PF_4TH is input to the register PF_3RD of the second stage, and the register PF_3RD holds and outputs the data at a clock timing.

Output of the register PF_3RD is input to the register PF_2ND of the third stage, and the register PF_2ND holds and outputs the data at a clock timing. Output of the register PF_2ND is input to the register PF_1ST of the fourth stage, and the register PF_1ST holds and outputs the data at a clock timing.

By configuring a register group as depicted in FIG. 14, the signal PASS is transmitted in a bucket relay manner to the four registers that are configured in a sequential series manner according to a clock timing supplied to each register. Finally, four times of results in response to four times of clocks can be held within the state machine 29. The four times of clocks are synchronized with determination of data in the registers PF_1ST, PF_2ND, PF_3RD, and PF_4TH, a result of step S106 is held in the register PF_4TH, a result of step S105 is held in the register PF_3RD, a result of step S104 is held in the register PF_2ND, and a result of step S103 is held in the register PF_1ST.

Figure 2:
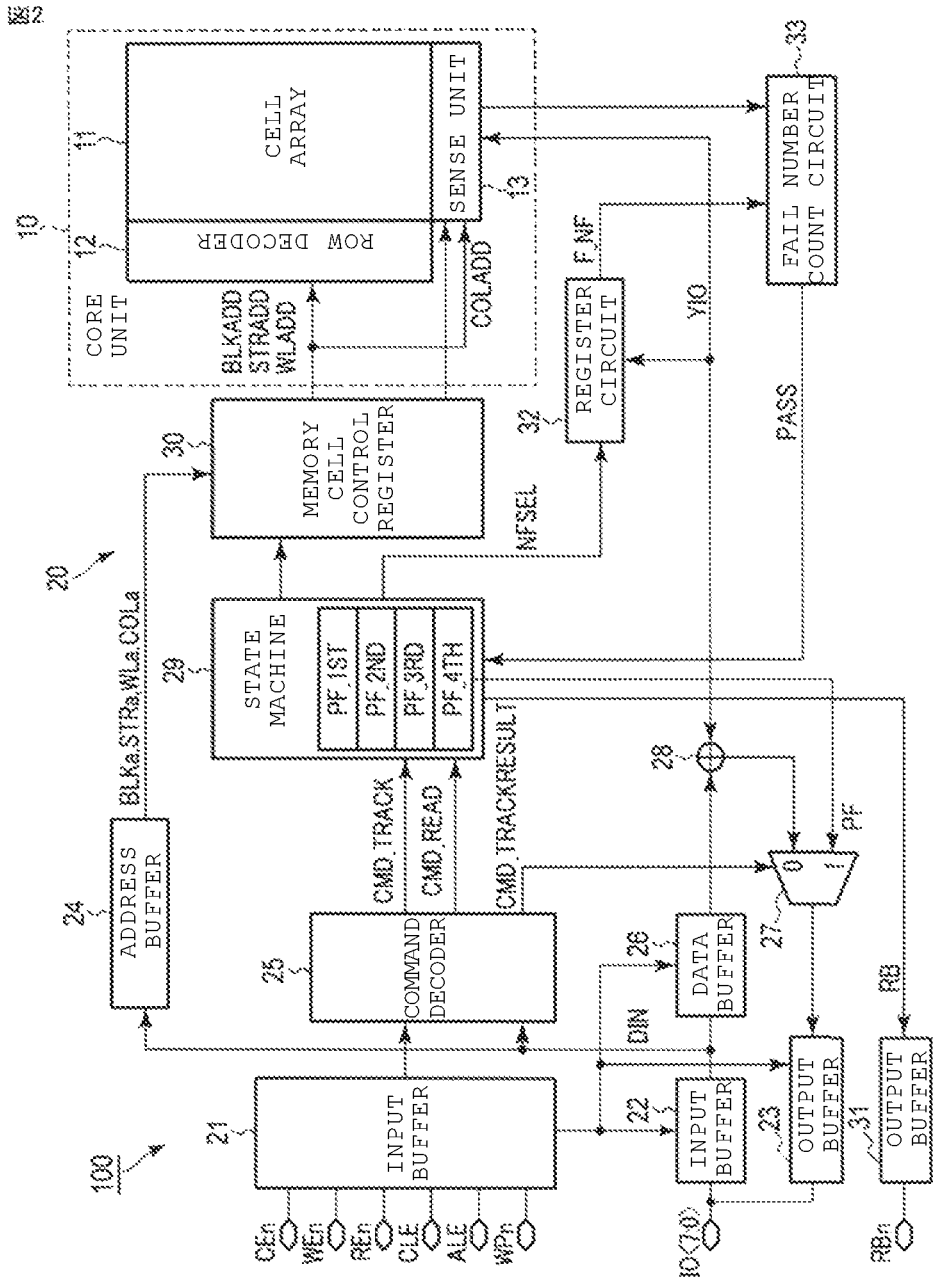
FIG. 2 is a block diagram of a NAND-type flash memory.

In addition, as illustrated in FIG. 2, results of the registers PF_1ST, PF_2ND, PF_3RD, and PF_4TH can be output to the input and output signal IO<7:0> of the device. Specifically, the command decoder 25 decodes commands received through the input buffer 21, and activates a signal CMD_TRACKRESULT. With this, the selection circuit 27 is configured to select the signal PF for transmitting any one or all of data held in the registers PF_1ST, PF_2ND, PF_3RD, and PF_4TH of the state machine 29, rather than an output from the sense unit 13. The signal PF is output to the input and output signal IO<7:0> through the output buffer 23. As described above, by outputting a result obtained by performing an optimum value search within the device, the result can be used as information for analysis and re-search when a question is generated in a result of following search read.

1-3 Specific Example of Optimum Value Read

Figure 15:
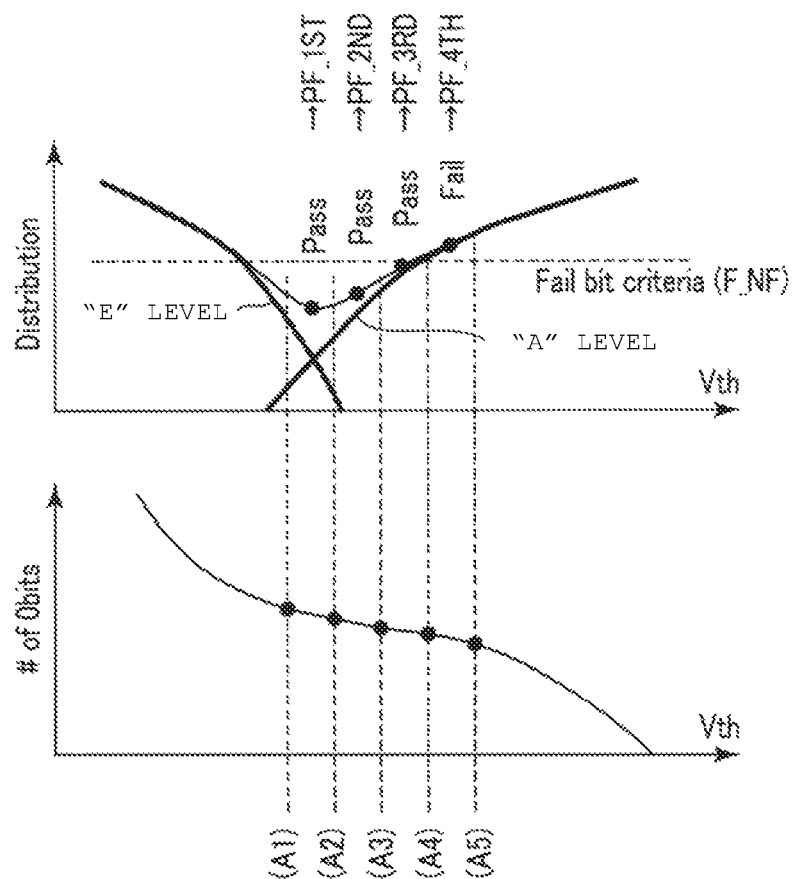
FIG. 15 is a diagram illustrating aspects of an example of a read result in the optimal value search read.

FIG. 15 illustrates an example of each read result from the (A1) read to the (A5) read. Specifically, the diagram at the bottom portion of FIG. 15 illustrates the number of bits (Vth and # of 0 bits) of data "0" in each read result of the (A1) read to the (A5) read, and a diagram at the top of FIG. 15 illustrates the number of the memory cells (Vth-distribution) having a threshold voltage is in each interval from the (A1) read to the (A5) read. In addition, FIG. 15 also illustrates a result ("Pass" or "Fail") compared with a certain reference value (fail bit criteria: F_NF). This pass/fail result is stored in the registers PF_1ST, PF_2ND, PF_3RD, and PF_4TH.

Here, "Pass" represents number of "mismatched" cells is equal to or less than the fail bit reference value F_NF, and "Fail" represents that the number exceeds the fail bit reference value F_NF. More specifically, when indicating "Pass," the data "1" is stored in the registers PF_1ST, PF_2ND, PF_3RD, and PF_4TH, and when "Fail," data "0" is stored in the registers PF_1ST, PF_2ND, PF_3RD, and PF_4TH.

FIG. 16 illustrates an example of a determination table for determining an optimum read level based on results in the four registers PF_1ST, PF_2ND, PF_3RD, and PF_4TH. However, the present embodiment is not limited to this determination scheme. For example, a plurality of reference values could also be adopted. Some other example embodiments will be described below.

There are 16 determination results with respect to the four registers PF_1ST, PF_2ND, PF_3RD, and PF_4TH. For example, when the example of FIG. 15 is used, since PF_1ST=1, PF_2ND=1, PF_3RD=1, and PF_4TH=0, it is determined that any one of (A1), (A2), and (A3) is equal to or lower than the reference value as Pass. However, (A1) can be determined as optimum by considering margin. When PF_1ST=1, PF_2ND=0, PF_3RD=1, and PF_4TH=0, it might be determined that there is considerable noise in a distribution shape and there would be no read level determined as optimum ("optimum value is not found").

In addition, although not specifically illustrated, there is also a method for obtaining an average of a plurality of signal states of the registers PF_1ST, PF_2ND, PF_3RD, and PF_4TH. When PF_1ST=1, PF_2ND=1, PF_3RD=1, and PF_4TH=0, (A2) may be considered optimum since PF_2ND is a middle value.

As another example, although not specifically illustrated, when PF_1ST=1, PF_2ND=0, PF_3RD=1, and PF_4TH=1, the result of the PF_1ST may be adopted by considering that a movement direction of the threshold distribution is likely toward a lower threshold direction, that is, it may be determined in this instance that (A1) is optimum due to the expected downward shift in threshold voltage. Alternatively, it may be determined that (A4) is optimum since PF_3RD=1 and PF_4TH=1 are continuous. In brief, various methods for setting the point determined as optimum from a plurality of the result registers may be provided.

Furthermore, as another example, when a point determined as optimum from a result of PF_1ST to PF_4TH is, for example, in the middle of (A1) and (A2) (i.e., in 1ST interval), it may be determined that a voltage between (A1) and (A2) voltage level is the optimum value. That is, an optimum value calculated or set based on reading results at voltage levels (A1) to (A5) may be a value that is not equal to any one of the voltage levels (A1) to (A5). In brief, various methods for selecting a voltage determined as optimum in association with results of a plurality of the result registers may be provided.

1-4 Command Sequence

Figure 17:
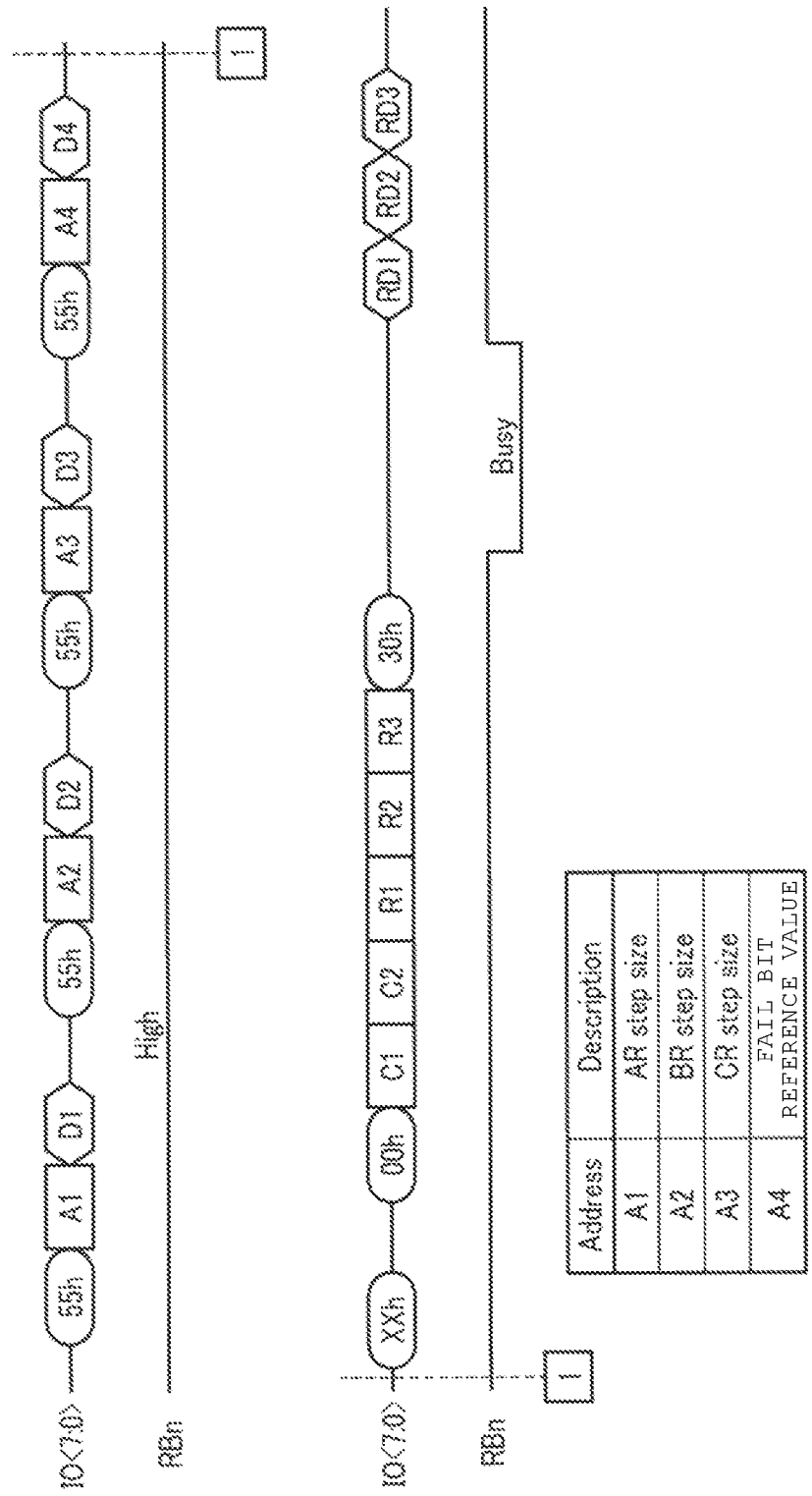
FIG. 17 is a diagram illustrating aspects of command sequence in the search read.

FIG. 17 is a diagram for explaining aspects of a command sequence in the search read.

Prior to a read command "00h", the memory controller 200 transmits accuracy information of the "A" level optimum value search read to the NAND-type flash memory 100. Specifically, the memory controller 200 transmits a read preset command "55h", an address "A1", and data "D1" to the NAND-type flash memory 100. The address "A1" is an address designating a memory area for storing accuracy information for the "A" level. The data "D1" is accuracy information of the "A" level optimum value search read.

In the execution of several optimum value search reads, the accuracy information includes information of the word line voltage level (for example, 50 mV) which may change in each of the several optimum value search reads, information on the number of times of the read is to be performed, a voltage corresponding to the (A1) read (that is, information about the word line voltage for an initial optimum value search read), or the like. Other information can be also supplied.

The memory controller 200 transmits accuracy information of "B" level optimum value search read to the NAND-type flash memory 100. Specifically, the memory controller 200 transmits the read preset command "55h", an address "A2", and data "D2" to the NAND-type flash memory 100. The address "A2" is an address designating a memory area for storing accuracy information for the "B" level.

The memory controller 200 transmits accuracy information of the "C" level optimum value search read to the NAND-type flash memory 100. Specifically, the memory controller 200 transmits the read preset command "55h", an address "A3", and data "D3" to the NAND-type flash memory 100. The address "A3" is an address designating a memory area for storing accuracy information for the "C" level.

The memory controller 200 also transmits the fail bit reference value F_NF to the NAND-type flash memory 100. Specifically, the memory controller 200 transmits the read preset command "55h", an address "A4", and data "D4" to the NAND-type flash memory 100. The address "A4" is an address designating a memory area for storing the fail bit reference value F_NF. The data "D4" is a code corresponding to the fail bit reference value F_NF.

The memory controller 200 next transmits a mode command "XXh" for performing the optimum value search read to the NAND-type flash memory 100.

The memory controller 200 then issues a read command. Specifically, the memory controller 200 transmits the read command "00h", column addresses "C1" and "C2", low addresses "R1", "R2", and "R3", and an execution command "30h" to the NAND-type flash memory 100.

The NAND-type flash memory 100 receives the read command, then outputs RBn=0 (i.e., a busy signal), and performs a read operation in response to the read command. In this read operation, the optimum value read (a read at a read voltage level determined as optimum through the optimum value search read) is performed.

After completing the read operation, the NAND-type flash memory 100 outputs RBn=1 (i.e., a ready signal), and transmits optimum read results "RD1", "RD2", and "RD3" to the memory controller 200. Command sequence of FIG. 17 is only an example, and another sequence may be also implemented if the same result is otherwise obtained. For example, a part or all of information transmitted to the NAND-type flash memory 100 prior to the read command "00h" may be omitted.

1-5 Read Target in Search Read

Figure 18:
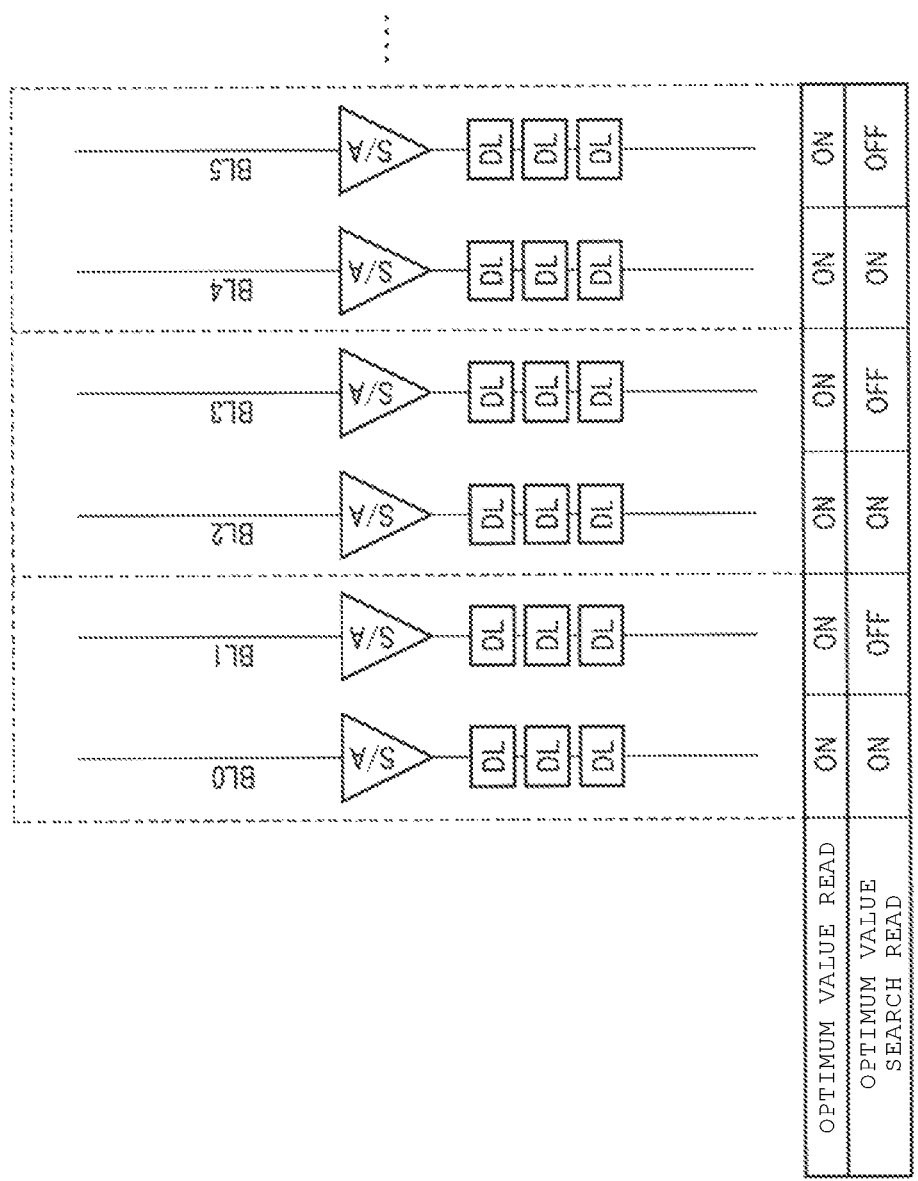
FIG. 18 is a diagram illustrating aspects of a difference of read targets in the search read.

FIG. 18 is a diagram for explaining difference of read targets between the optimum value search read and the optimum value read. FIG. 18 illustrates the sense unit 13 while illustrating only six-bit lines; however, the number of bit lines is not limited to six. Three DLs (data latch) in series illustrated in FIG. 18 correspond to the caches ADL, BDL, and XDL.

In this present embodiment, since it is preferable that the optimum value search read is accurately performed over a short time period, it is necessary that the optimum value search read be performed during a short as possible time period and the optimum value read is to be performed at the same timing as that of normal read. Each bit line BL is connected to a sense amplifier S/A on a one-to-one basis. When it is being determined whether or not the memory cell connected to the bit line BL is in a conduction state, the sense amplifier S/A determines the cell state by continuously flowing a normal current in the bit line BL.

Here, the optimum value search read adopts a configuration in which the sense amplifiers S/A are alternately turned on and off in the plurality of the bit lines BL. More specifically, the bit line BL 0 sets the sense amplifier as a sense target to a turned on state, and the bit line BL 1 sets the sense amplifier as a non-sense target to a turned off state.

For example, the voltage Vss (e.g., ground voltage, 0 V) is applied to a bit line connected to the sense amplifier of the turned off state.

When normal current sensing is performed, there is a need for a certain waiting time for stabilization so as to limit the effect of noise caused by voltage fluctuation in an adjacent bit line on a sense result. However, in the present embodiment, the adjacent bit line (which has been grounded) is used as a shield line such that the effect of noise is suppressed.

When use of a single shield line is insufficient for purposes of noise suppression, a sensing configuration in which four bit lines BL are conceptually combined, and one bit line of the four is set as sense target in the optimum value search read, and the other three bit lines are set to a turned off state (grounded), may be implemented. The control for setting the sense amplifier to one of the turned on state and the turned off state is performed by the memory cell control register 30 illustrated in FIG. 2.

1-6 Effect of Embodiment

In this present embodiment, the search read combining the optimum value search read and the optimum value read is performed during the read operation. In the optimum value search read, reading is performed at a plurality of read levels. Accordingly, an optimum read level (word line voltage) is determined by using a result of the optimum value search read, and the optimum value read is then performed at this optimum read level.

Thus, in this present embodiment, a NAND-type flash memory 100 capable of improving the performance of reading can be realized. Specifically, it is possible to more accurately read data stored in the NAND-type flash memory 100. Particularly, even when storing data over a relatively long time period (long-term storage), it is possible to more accurately perform the read operation.

In addition, rather than performing the optimum value search read for the entirety of the bit lines, the optimum value search read can, in some embodiments, be performed with respect to every other bit line. With this, it is possible to shorten a search read time by performing the optimum value search read a higher speed through data thinning. When there is a sufficient time in the optimum value search read, it is possible to process the same target data range as the optimum value read by performing information compression achievable by using the cache ADL, the cache BDL, or another cache, similar to a case where the optimum value search read is performed alone.

In addition, it is possible to perform the optimum read by a command for performing search read by implementing some functions in the memory system 1. With this, it is possible to realize the optimum value search read and the optimum value read by adding fewer functions. However, there is a problem that the size of device increases in the implementation of the some functions. Thus, it is possible to minimize device size by substantially using conventional functions.

2 First Modification Example

FIG. 7 illustrates a configuration that the "A" level optimum value search read is performed five times and the "C" level optimum value search read is performed six times. The number of times may be changed according to an object and an implementation time of the search read, and the combination thereof can be properly changed.

In addition, the number of times of the "A" level optimum value search read may be the same as or different from the number of times of the "C" level optimum value search read.

It is contemplated that data retention properties may be different according each threshold voltage level of the memory cells and thus modifications to the process according to these characteristics may be performed.

3 Second Modification Example

FIG. 6 illustrates a configuration for storing two bits in one cell. However, the present disclosure is not limited thereto. A configuration for storing three bits in one cell, a configuration for storing four bits or more in one cell, or a configuration for storing bits of an integer equal to or greater than one by using a plurality of cells may be implemented.

It is possible to apply a threshold voltage level required for reading and the number of times of reading to the NAND-type flash memory 100 according to these various requirements, and increase or decrease process flows depicted FIG. 9 and FIG. 10, and also the number of registers used for storing read results illustrated in FIG. 14 according to these requirements.

In addition, it is also possible to increase and decrease types of command for search read command and given data illustrated in FIG. 14 according to requirements.

4 Third Modification Example

In FIG. 11 to FIG. 13, when reading is performed at a plurality of read levels during the optimum value search read, an algorithm for counting the number of bits of the memory cells with a threshold voltage in a particular interval is described. Particularly, as a specific example of calculation, the cache operations required for each step is illustrated in FIG. 11.

Preferably, it is possible to accurately search and determine an optimum value by this method of the calculation. However, in an actual read operation, particularly when the read level and the cell threshold voltage are close, there is a case where the read result is uncertain due to various noises that are received. In this case, an ideal distribution pattern as depicted in FIG. 15 is not formed, an erroneous determination for an optimum value can occur, and then an error will finally occur in the search read.

In view of this point, FIG. 19 illustrates an example in which the required operation of FIG. 11 is changed. Here, a part of operations performed in steps S104, S105, and S106 is changed. In steps S104, S105, and S106, the state machine 29 performs an AND operation on data of the cache ADL and inverted data of the cache BDL, and the AND operation result is stored in the cache BDL.

With this, a result of the optimum value search read up to the previous read step remains in the cache BDL, in many cases. More specifically, as the result of the optimum value search read until immediately before the present read step, if it is determined that a corresponding cell is changed even once, that is, one cell is changed to zero cell when reading is performed from the low word line voltage, even when reading is performed once again as the one cell due to noise or the like later, a result thereof is not reflected in the cache. Therefore, the result is not also involved in a result of optimum value determination. By using a simple method of cancellation of noise components, it is possible to reduce error rate of the search read.

5 Fourth Modification Example

FIG. 17 illustrates that the optimum value search read and the optimum value read are continuously performed in response to one command, and the ready and busy pin RBn of the NAND-type flash memory 100 is in a ready state, that is, a state capable of performing read, immediately.

Figure 20:
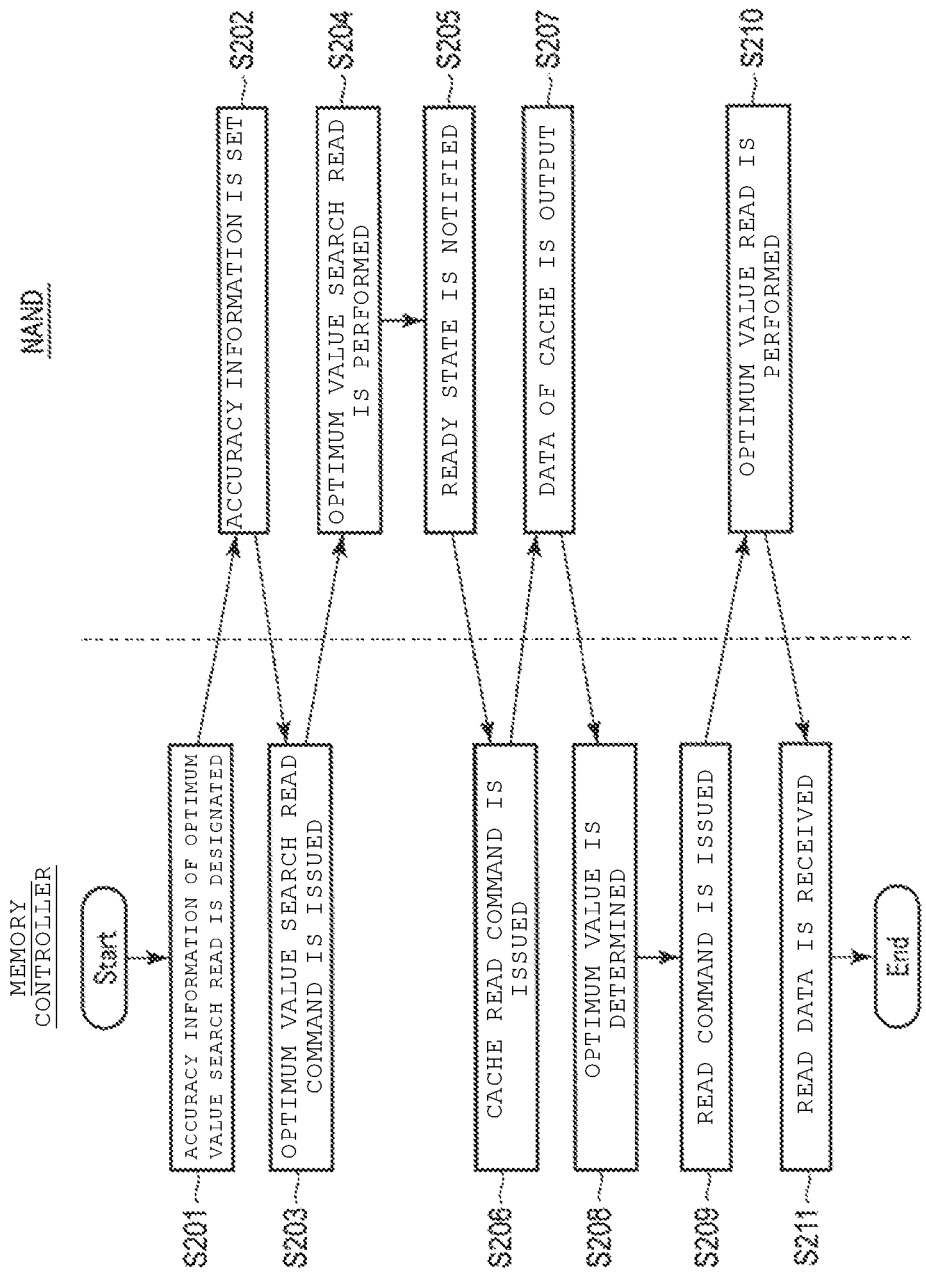
FIG. 20 is a flow chart illustrating aspects of search read according to a fourth modification example.

However, it may be difficult to change the optimum value calculation algorithm to account for possible errors in the search read after configuring a system of according to the embodiment depicted in FIG. 1. The fourth modification example discloses another embodiment in view of this point. FIG. 20 is a flow chart for explaining aspects of the optimum value search read and the optimum value read according to the fourth modification example.

The memory controller 200 transmits accuracy information of the optimum value search read to the NAND-type flash memory 100 (step S201). The accuracy information includes a start word line voltage (word line voltage information for an initial optimum value search read), a step voltage, and the number of steps (increments). It is also possible to provide other information. In step S201, for example, the read preset command "55h" described in FIG. 17 is used. The NAND-type flash memory 100 stores the accuracy information for the optimum value search read in a predetermined register (step S202).

The memory controller 200 transmits a mode command for performing the optimum value search read to the NAND-type flash memory 100 (step S203). The NAND-type flash memory 100 performs the optimum value search read (step S204).

Figure 21:
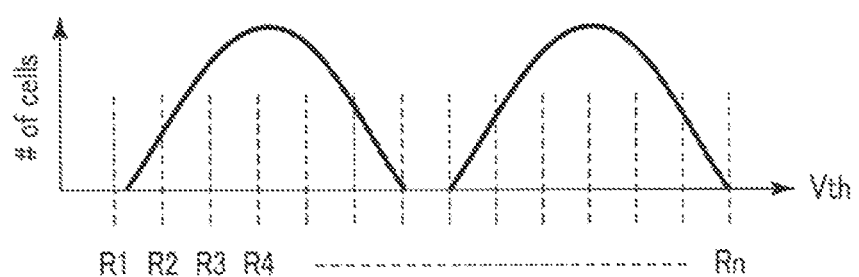
FIG. 21 is a diagram illustrating aspects of a read level in the optimal value search read according to the fourth modification example.

FIG. 21 is a diagram for explaining a read level in the optimum value search read. The state machine 29 performs a plurality of read operations from a level R1 to a level Rn (here, n is natural number equal to or greater than three). According to the read operation, a threshold voltage of cells is determined by the sense amplifier S/A and a result thereof is stored in the cache as data "1" or data "0."

Figure 22:
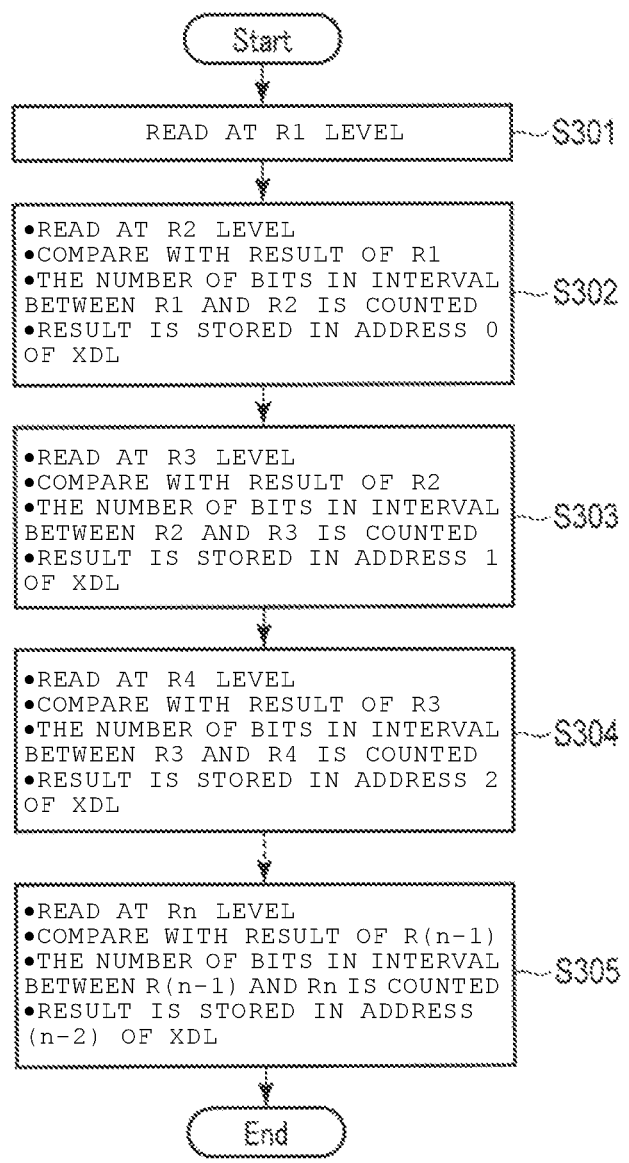
FIG. 22 is a flow chart illustrating aspects of the optimal value search read according to the fourth modification example.

FIG. 22 is a flow chart for explaining aspects of the optimum value search read of the NAND-type flash memory 100. FIG. 23 is a diagram for explaining aspects of data of the cache XDL.

The state machine 29 reads data of the memory cells at the level R1 as a read level (step S301). A result thereof is stored in a proper cache.

The state machine 29 reads data of the memory cells at the level R2. A result thereof is stored in a proper cache so as to not lose the result from step S301. The state machine 29 counts bits in which the result from reading has changed, that is, the number of the memory cells having a threshold voltage in an interval between level R1 and R2 by using the results of R1 read and R2 read. Accordingly, a result thereof is stored, for example, in a column address 0 of the cache XDL (step S302).

As a unit for counting the number of the memory cells of which a threshold is in a certain interval, for example, it is possible to use the fail number count circuit 33 illustrated in FIG. 2. In some embodiments, a unit that is within another device may be used. In addition, a storing location of the result is not limited to the column address 0. Briefly, if a correspondence relationship between the read level and the column address is uniquely determined, a method thereof may be used. The cache XDL is configured with eight bits per address in many cases. However, a counted result may require only two bytes. Furthermore, configurations including items such as a redundant configuration, parity data, and majority determination, may be implemented to improve data credibility (quality).

The state machine 29 reads data of the memory cells at the level R3. A result thereof is stored in a proper cache so as to not lose the result of step S302. The state machine 29 counts bits in which the result of the read has changed, that is, the number of the memory cells having a threshold voltage in an interval between R2 and R3 by using the results of R2 read and R3 read. Accordingly, a result thereof is stored, for example, in a column address 1 of the cache XDL (step S303).

By repeating the above control, the state machine 29 reads data of the memory cells up to the level Rn. A result thereof is stored in a proper cache in order to not lose a result of the preceding step. The state machine 29 counts bits in which the result of read has changed, that is, the number of the memory cells having a threshold voltage in an interval between level R(n−1) and Rn by using the results of R(n−1) read and Rn read. Accordingly, a result thereof is stored, for example, in a column address (n−2) of the cache XDL (step S305). Accordingly, the optimum value search read is completed.

Returning to FIG. 20, the NAND-type flash memory 100 notifies the memory controller 200 of a ready state, that is, the optimum value search read is completed (step S205). The memory controller 200 issues a command (cache read command) for reading data of the cache to the NAND-type flash memory 100 (step S206). In response to this, the NAND-type flash memory 100 outputs data (result of optimum value search read) of the cache XDL to the memory controller 200 (step S207).

The memory controller 200 determines at least one optimum value of the "A" level, the "B" level, and the "C" level by using a result of the optimum value search read (step S208). This determination operation, for example, is the same as that of FIG. 16.

In step S209, the memory controller 200 issues a read command to the NAND-type flash memory 100. In response to this, the NAND-type flash memory 100 performs the optimum value read (step S210). Then, the memory controller 200 receives read data from the NAND-type flash memory 100 (step S211).

The fourth modification example is different from the above first embodiment in that a counted result obtained by counting the number of the memory cells having a threshold voltage in a certain interval is stored in the cache XDL. In the fourth modification example, the optimum value determination algorithm, which was previously fixed, can be provided in the memory controller 200 in a revisable manner because the NAND-type flash memory 100 provides only the counted results. A result of the optimum value search read is transmitted to the memory controller 200 of FIG. 1 or otherwise output according to a command of the memory controller 200. Accordingly, the characteristics associated with optimum value read command are provided by determination of the memory controller 200.

Figure 24:
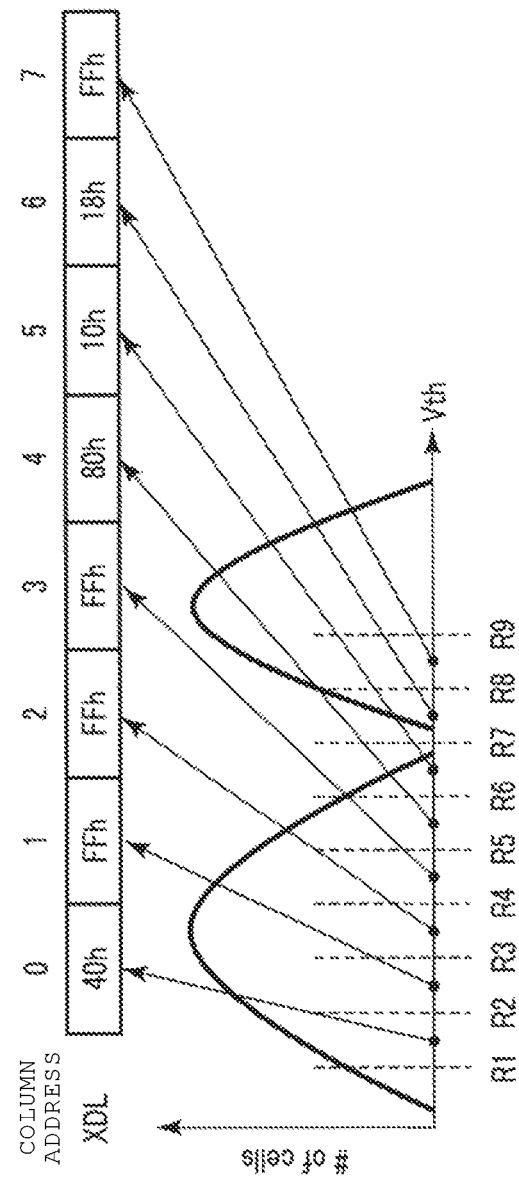
FIG. 24 is a diagram illustrating aspects of a specific example of the data of the cache according to the fourth modification example.

FIG. 24 is a diagram for explaining a specific example of data in the cache XDL according to the fourth modification example. Reading nine times from a level R1 to a level R9 is performed.

A result obtained by counting the memory cells having a threshold voltage in an interval between R1 and R2 is stored in the column address 0, and a result obtained by counting the memory cells having a threshold voltage in an interval between R2 and R3 is stored in the column address 1. For example, a result indicating that there are memory cells of 64 bits (40h) is stored in the column address 0. Although 255 bits (FFh) is recorded in the column address 1, the fail number count circuit 33 may have a countable upper limitation and store a result indicating that there are memory cells of equal to or greater than 255 bits in this case. Furthermore, when counting in the same manner, results indicating that there are memory cells of 128 bits (80h) in an interval between R5 and R6, 16 bits (10h) in an interval between R6 and R7, 24 bits (18h) in an interval between R7 and R8, and 255 bits or more in an interval between R8 and R9, are stored.

In the fourth modification example, optimum value determination is provided in firmware in the memory controller 200. Generally, even after configuring a system including the NAND-type flash memory 100 and the memory controller 200, the firmware can be rewritten and modified, thus a degree of freedom in selecting an optimum algorithm is obtained.

Figure 25:
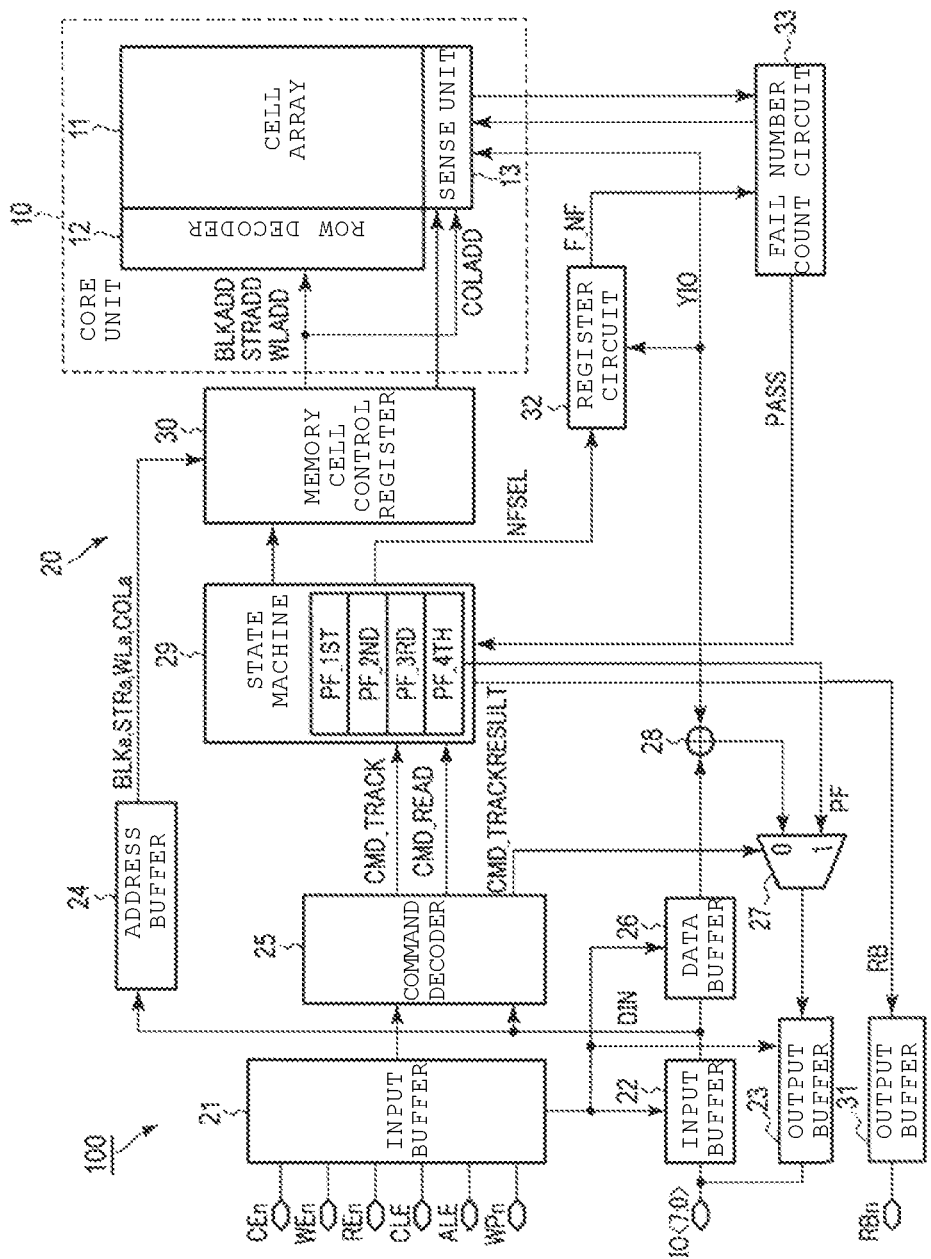
FIG. 25 is a block diagram of a NAND-type flash memory according to the fourth modification example.

FIG. 25 illustrates a configuration example of the NAND-type flash memory 100 incorporating the fourth modification example. A signal for indicating fail bits from the fail number count circuit 33 to the sense unit 13 is added. The fail number count circuit 33 can transmit a result obtained by counting the number of the fail bits to the cache within the sense unit 13.

6 Fifth Modification Example

In the fourth modification example, only the optimum value search read is performed by a separate command. As such, an optimum value read is performed by another command. Thus, the optimum value search read is not performed by thinning the number of the bit line BL (as illustrated in FIG. 18), rather the optimum value search read may be performed with respect to the all bit lines, similar to the case of the optimum value read. A result thereof may be processed in an information compression manner by using the caches ADL and BDL. When the fifth modification example is performed, the number of required caches can be modified to caches of the optimum number rather than the configuration illustrated in FIG. 4.

7 Sixth Modification Example

When one memory cell transistor holds two-bit data, a threshold voltage thereof reflects one of four levels according to the holding data. When the four level types are an erase level, an A level, a B level, and a C level in order from the lowest level, a voltage applied to a selected word line at the time of a read operation in the A level is between, for example, 0V and 0.55 V. However, this embodiment is not limited thereto. The voltage may be between one of 0.1 V and 0.24 V, 0.21 V and 0.31 V, 0.31 V and 0.4 V, 0.4 V and 0.5 V, 0.5 V and 0.55 V, and the like. A voltage applied to a selected word line at the time of a read operation in the B level is between, for example, 1.5 V and 2.3 V. However, this embodiment is not limited thereto. The voltage may be between one of 1.65 V and 1.8 V, 1.8 V and 1.95 V, 1.95 V and 2.1 V, 2.1 V and 2.3 V, and the like. A voltage applied to a selected word line at the time of a read operation in the C level is between, for example, 3.0 V and 4.0 V. However, this embodiment is not limited thereto. The voltage may be between one of 3.0 V and 3.2 V, 3.2 V and 3.4 V, 3.4 V and 3.5 V, 3.5 V and 3.6 V, 3.6 V and 4.0 V, and the like. A time (tR) of the read operation may be between one of 25 µs and 38 µs, 38 µs and 70 µs, 70 µs and 80 µs, or the like, in some embodiments.

A write operation includes a program step and program verification step. In the write operation, a voltage applied to the word line selected in the programming, for example, is between 13.7 V and 14.3 V. However, this embodiment is not limited thereto. For example, the voltage may be between one of 13.7 V and 14.0 V, 14.0 V and 14.6V, and the like. A voltage applied to a selected word line at the time of writing to an odd-numbered word line may be different from a voltage applied to a selected word line at the time of writing in an even-numbered word line. When a method of a program operation is an incremental step pulse program (ISPP) method, a step up voltage is approximately, for example, 0.5 V. A voltage applied to a non-selected word line may be a voltage between 6.0 V and 7.3 V. However, this embodiment is not limited thereto. For example, the voltage may be between 7.3 V and 8.4 V, or equal to or lower than 6.0 V. An applied path voltage may be different according to whether the non-selected word line is an even-numbered word line or an odd-numbered word line. A time of the write operation (tProg) may be between, for example, 1,700 µs and 1,800 µs, 1,800 µs and 1,900 µs, or 1,900 µs and 2,000 µs.

In an erase operation, a voltage applied to wells in a semiconductor substrate on which the memory cells are arranged is between, for example, 12.0 V and 13.6 V. However, this embodiment is not limited thereto. For example, the voltage may be between one of, for example, 13.6 V and 14.8 V, 14.8 V and 19.0 V, 19.0 V and 19.8 V, 19.8 V and 21 V, and the like. A time of the erase operation (tErase) may be between, for example, 3,000 µs and 4,000 µs, 4,000 µs and 5,000 µs, or 4,000 µs and 9,000 µs.

In addition, for example, the memory cell(s) may have structures as described below. The memory cell(s) includes a charge storage film arranged on a tunnel isolation film having a thickness of 4 nm to 10 nm on the semiconductor substrate such as a silicon substrate. The charge storage film can be implemented with a layered structure of an insulating film such as a silicon nitride (SiN) film or a silicon oxynitride (SiON) film having a thickness of 2 nm to 3 nm, and a polysilicon (Poly-Si) film having a thickness of 3 nm to 8 nm. Metal such as ruthenium (Ru) may be added to the polysilicon film. The memory cell includes an insulating film on the charge storage film. The insulating film includes, for example, a silicon oxide (SiO) film having a thickness of 4 nm to 10 nm between a lower layer high-k film having a thickness of 3 nm to 10 nm and an upper layer high-k film having a thickness of 3 nm to 10 nm. As material of the high-k film, hafnium oxide (HfO) or the like can be provided. In addition, the thickness of the silicon oxide film can be greater than that of the high-k film. Control electrodes having a thickness of 30 nm to 70 nm are provided on the insulating film via a work function adjustment film having a thickness of 3 nm to 10 nm. Here, the work function adjustment film, is a metal oxide film such as a tantalum oxide (TaO), or the like, or a metal nitride film such as a tantalum nitride (TaN), or the like. Tungsten (W), or the like, can be used in the control electrodes. Air gaps can be arranged between the memory cells.

In the present disclosure, an example of a three-dimensional stacked nonvolatile semiconductor memory device on which a plurality of memory cells are stacked on a substrate is described. However, the present disclosure is not limited thereto, and can be implemented so as to be applied to a two-dimensional nonvolatile semiconductor memory device on which a plurality of memory cells is arranged in a planar fashion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without depart-

What is claimed is:

1. A nonvolatile semiconductor memory device, comprising:
a memory cell array including a plurality of memory cells, each of which can be programmed to have a different threshold voltage;
a word line connected to the plurality of memory cells; and
a controller configured to receive a first command and to perform a first read sequence and a second read sequence to read data from the memory cell array, wherein
in the first read sequence, a series of different voltage levels are applied to the word line to read data from the memory cell array at each different voltage level, and
in the second read sequence, a read voltage level set based on the data read from the memory cell array during the first read sequence is applied to the word line to read the data from the memory cell array in response to the first command, wherein the read level voltage is calculated outside of the controller.

2. The device according to claim 1, wherein a read target address is supplied with the first command, and a number of bits read from the memory cell array at each of the different voltage levels in the series is less than a number of bits corresponding to the read target address.

3. The device according to claim 1, wherein the controller is further configured to:
compare a read result at a first voltage level in the series to a read result at a second voltage level in the series and to calculate a first difference result from the comparison,
compare the read result at the second voltage level to a read result at a third voltage level in the series and to calculate a second difference result from the comparison, and
set the read voltage level using the first and second difference results.

4. The device according to claim 3, wherein the controller is configured to set the read level voltage according to a comparison between the first difference result and a reference value and a comparison between the second difference result and the reference value.

5. The device according to claim 4, further comprising:
a first register in which a result of the comparison between the first difference result and the reference value can be stored; and
a second register in which a result of the comparison between the second difference result and the reference value can be stored, wherein
the controller causes the output of information stored in the first and second registers in response to a second command.

6. The device according to claim 5, wherein a value of the read level voltage is supplied to the controller with a third command.

7. The device according to claim 1, wherein the read level voltage is equal to one of the voltage levels in the series of different voltage levels.

8. The device according to claim 1, wherein the read level voltage is between two voltage levels that are adjacent to each other in the series of different voltage levels.

9. A nonvolatile semiconductor memory device, comprising:
a memory cell array that includes a plurality of memory cells, each of which can programmed to have one of a first threshold voltage and a second threshold voltage;
a word line connected to the plurality of memory cells; and
a controller configured to:
perform a first read sequence comprising applying a series of different voltage levels to the word line to read data from the memory cell array at each different voltage level and storing the data read from the memory cell array in a cache, and
perform a second read sequence comprising applying a read level voltage to the word line and reading data stored in the memory cell array at a target address and outputting the data from the target address, wherein
the read level voltage is set based on the data read from memory cell array in the first read sequence, and
the read level voltage is calculated outside of the controller.

10. The device according to claim 9, the controller performs the first read sequence and the second read sequence in response to a first command accompanied by the target address.

11. The device according to claim 9, wherein the controller performs the first read sequence in response to a first command, outputs the data stored in the cache in response to a second command, and performs the second read sequence in response to a third command accompanied by a value for the read level voltage.

12. The device according to claim 9, wherein the controller is further configured to:
compare a read result at a first voltage level in the series to a read result at a second voltage level in the series to calculate a first difference result,
compare the read result at the second voltage level to a read result at a third voltage level in the series to calculate a second difference result, and
set the read voltage level using the first and second difference results.

13. The device according to claim 9, wherein the read level voltage is between two voltage levels that are adjacent to each other in the series of different voltage levels.

14. A NAND-type memory device, comprising:
a memory cell array including memory cells in which data can be stored by programming a threshold voltage for one of more memory cells in the memory cell array; and
a controller configured to:
perform an optimum value search read on at least a portion of the memory cell array, the optimum value search read including data read operations on at least the portion of the memory cell at a series of different voltage levels, and
perform an optimum value read on at least a targeted portion of the memory cell array, the optimum value read including a data read operation at a read voltage level set according to results from the data read operations in the optimum value search read, wherein
the read voltage level is calculated outside the controller.

15. The NAND-type memory device of claim 14, wherein the controller is configured to perform the optimum value search read in response to a first command, to output the results from the data read operations in the optimum value search read in response to a second command, and to perform the optimum value read in response to a third command accompanied by a calculated value for the read voltage level for the optimum value read.

* * * * *